US006284433B1

(12) United States Patent
Ichikawa et al.

(10) Patent No.: US 6,284,433 B1
(45) Date of Patent: Sep. 4, 2001

(54) METHOD OF PRODUCING DIRECTLY IMAGEABLE WATERLESS PLANOGRAPHIC PRINTING PLATE

(75) Inventors: Michihiko Ichikawa; Seigo Miyaguchi; Mitsuru Suezawa; Kimikazu Nagase; Shingo Aoki; Kazuki Goto; Gentaro Ohbayashi, all of Shiga (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 09/534,343

(22) Filed: Mar. 24, 2000

(30) Foreign Application Priority Data

| | | |
|---|---|---|
| Mar. 26, 1999 | (JP) | 11-084178 |
| Apr. 23, 1999 | (JP) | 11-116031 |
| Apr. 27, 1999 | (JP) | 11-119404 |
| Nov. 11, 1999 | (JP) | 11-321339 |

(51) Int. Cl.[7] .................... G03F 7/30; G03F 7/38

(52) U.S. Cl. .................... 430/303; 101/463.1; 430/944; 430/945; 430/272.1

(58) Field of Search .................... 430/303; 101/463.1

(56) References Cited

U.S. PATENT DOCUMENTS

| | | | | |
|---|---|---|---|---|
| 4,496,647 | | 1/1985 | Kawabe et al. | 430/303 |
| 5,773,187 | * | 6/1998 | Gries | 430/303 X |
| 5,786,125 | | 7/1998 | Tsuchiya et al. | 430/303 |
| 5,849,464 | * | 12/1998 | Yokoya et al. | 430/303 |
| 5,919,600 | * | 7/1999 | Huang et al. | 430/303 |
| 5,958,652 | * | 9/1999 | Suezawa et al. | 430/303 |

FOREIGN PATENT DOCUMENTS

| | | |
|---|---|---|
| 802 067 | 10/1997 | (EP) . |
| 897 795 | 2/1999 | (EP) . |
| 914 942 | 5/1999 | (EP) . |

* cited by examiner

*Primary Examiner*—Cynthia Hamilton
(74) *Attorney, Agent, or Firm*—Morrison & Foerster LLP

(57) ABSTRACT

A directly imageable waterless planographic printing plate, which has at least the heat sensitive layer and an ink repellent layer in this order on a substrate, having a high sensitivity and good image reproducibility and allowing a heat sensitive layer to remain even after development is produced by imagewisely irradiating a precursor of the printing plate with a laser beam, pre-treating the precursor by a pre-treatment liquid containing an amine compound by 0.1 to 30 wt % based on the weight of the entire pre-treatment liquid, and removing the ink repellent layer at the laser beam irradiated area, in this order, such that the heat sensitive layer is at least partially left on the printing plate after completion of the above steps.

7 Claims, No Drawings

METHOD OF PRODUCING DIRECTLY IMAGEABLE WATERLESS PLANOGRAPHIC PRINTING PLATE

BACKGROUND OF THE INVENTION

The present invention relates to a method of producing a directly imageable waterless planographic printing plate directly using a laser beam, particularly a method of producing a directly imageable waterless planographic printing plate which allows printing without using dampening water.

A process of producing an offset printing plate directly from an original without using a plate making film, the so-called directly imageable process (also called direct process) begins to be used also in the fields of general offset printing and gravure printing, as well as in the small-scale printing industry, because of such features as simplicity requiring little skill, speediness in obtaining a printing plate in a short time, and rationality of selectability adapted to desired quality and cost from a variety of systems. Especially recently, in response to the rapid progress of output systems such as prepress systems, image setters and laser printers, new types of various planographic printing plates for the direct process are being developed.

The processing methods for these planographic printing plates include methods of irradiating with a laser beam, methods of writing by a thermal head, methods of partially applying a voltage by a pin electrode, methods of forming an ink repellent layer or an ink acceptable layer by ink jet, etc.

Among them, the methods of using a laser beam are more excellent than the other methods in resolution and processing speed, and are diverse.

The planographic printing plates using a laser beam include the photon mode type based on photo reaction and the heat mode type in which thermal reaction is caused by light-heat conversion. The heat mode type can be advantageously handled in a daylight room, and its usefulness is being reviewed recently because of the sudden progress of semiconductor lasers used as the light sources.

For producing a planographic printing plate in the heat mode, particularly a waterless planographic printing plate not requiring the use of dampening water for printing, the following methods have been proposed, but they involve various problems.

For example, U.S. Pat. Nos. 5,339,737, 5,353,705, EP 0580393, etc. propose methods for forming a printing plate based on the ablation of the heat sensitive layer. However, these methods have such problems that a high laser energy is necessary for ablating the heat sensitive layer, that a byproduct such as gas is produced by ablation, being likely to adversely affect the optical system, that the residue of ablation must be removed, and that it is difficult to reproduce very small halftone dots.

For producing a printing plate using a developer, the following methods are proposed.

U.S. Pat. No. 5,378,580 proposes to rub the plate surface for development using a solvent (IPA) not swelling the ink repellent layer after laser beam irradiation. However, the use of IPA is unpreferable in view of environmental sanitation.

U.S. Pat. No. 5,849,464 proposes to give a liquid with a surface tension of 25 to 50 dyn/cm$^3$ (250 to 500 $\mu$N/cm$^2$) for rubbing after laser beam irradiation. However, since rubbing is effected with the ink repellent layer swollen, the ink repellent layer is likely to be flawed disadvantageously.

Japanese Patent Laid-Open (Kokai) No. Heill-198335, etc. propose on the removal of the ink repellent layer at the laser beam irradiated area in the presence of, for example, water or water containing a surfactant after laser beam irradiation. However, these methods have such problems that though halftone dots larger than a certain size can be reproduced, very small halftone dots can be reproduced only unstably, and that the ink acceptance of halftone dots is low.

Problems of the conventional waterless planographic printing plates as described above include that it is difficult to reproduce very small halftone dots and that the grooves formed by laser irradiation into which ink is to be accepted, hereinafter called the image ditch cells are deepened.

If the image ditch cells are deepened, the ink is built up to make the prints felt like being coarse. Furthermore, in rotary offset printing, a longer oven must be used, or the printing speed must be lowered to evaporate off the ink solvent. As described above, deep image ditch cells give many disadvantages in the printing process.

SUMMARY OF THE INVENTION

The problem of the present invention is to improve the disadvantages of the prior art by providing a method of producing a directly imageable planographic printing plate with the heat sensitive layer left, having high sensitivity and good image reproducibility.

To overcome the disadvantages of the prior art, this invention provides a directly imageable planographic printing plate with good image reproducibility.

(1) A method of producing a directly imageable waterless planographic printing plate, which has at least a heat sensitive layer and an ink repellent layer in this order on a substrate, comprising a first step of imagewisely irradiating a precursor of the printing plate with a laser beam, a second step of pre-treating the precursor by a pre-treatment liquid containing a glycol compound and/or a glycol ether compound represented by the following general formula (I), or a pre-treatment liquid containing an amine compound by 0.1 to 30 wt % based on the weight of the entire pre-treatment liquid, and a third step of removing the ink repellent layer at the laser beam irradiated area, in this order, to have the heat sensitive layer left at least partially still after completion of the above steps.

$$R^2O(—CHR^1—CH_2O)_n—R^3 \quad (I)$$

(where $R^1$ denotes a hydrogen atom or alkyl group with 1 to 5 carbon atoms; $R^2$ and $R^3$ denote, respectively independently, a hydrogen atom or alkyl group with 1 to 15 carbon atoms; and n denotes an integer of 1 to 12.)

(2) A method of producing a directly imageable planographic printing plate, according to said (1), wherein the light transmittance, in the heat sensitive layer, of the light with the same wavelength as that of the laser beam applied in the first step is less than 20%.

(3) A method of producing a directly imageable planographic printing plate, according to said (1), wherein the heat sensitive layer contains at least a compound (A) capable of absorbing a laser beam for generating heat and a compound (B) capable of causing reaction by heat for improving the dissolvability or swelling rate.

(4) A method of producing a directly imageable planographic printing plate, according to said (3), wherein the compound (B) capable of causing reaction by heat for improving the dissolvability or swelling rate is a combination comprising a metal-containing organic compound and an active hydrogen-containing compound.

(5) A method of producing a directly imageable planographic printing plate, according to said (1), wherein the liquid temperature of the organic solvent used for pre-treatment in the second step is 30 to 60° C. and the pre-treatment time is 10 to 100 seconds.

DESIRABLE EMBODIMENTS

In this invention, "directly imageable" means that an image is formed on the printing plate directly from a recording head without using a negative or positive film at the time of exposure. The method of producing a directly imageable waterless planographic printing plate of this invention contains a plate processing steps ranging from the exposure step of imagewisely irradiating a planographic printing plate precursor with a laser beam to the development step of patterning the printing plate by developing the exposed planographic printing plate.

The precursor of a directly imageable waterless planographic printing plate used in this invention is described below. The directly imageable waterless planographic printing plate precursor used in this invention has at least a heat sensitive layer and an ink repellent layer in this order on a substrate. A directly imageable waterless planographic printing plate precursor in which the ink repellent layer is mainly made of a silicone rubber is preferable.

<Constitution of Directly Imageable Waterless Planographic Printing Plate Precursor>

<Heat Sensitive Layer>

The heat sensitive layer of the directly imageable planographic printing plate precursor which can be especially preferably used in this invention comprises a compound (A) capable of absorbing a laser beam for generating heat and a compound (B) capable of causing reaction by heat for improving the dissolvability or swelling rate.

In the directly imageable waterless planographic printing plate precursor having a heat sensitive layer comprising (A) and (B), the surface of the heat sensitive layer is improved in dissolvability in an organic solvent at the laser beam irradiated area, to allow the ink repellent layer to be developed.

<(A) A Compound Capable of Absorbing a Laser Beam for Generating Heat, So-called Light-heat Converting Substance>

The compounds which can be used here as the light-heat converting substance include black pigments such as carbon black, titanium black, aniline black and cyanine black, green pigments of phthalocyanine and naphthalocyanine, carbon graphite, diamine metal complexes, dithiol metal complexes, phenolthiol metal complexes, mercaptophenol metal complexes, crystal water-containing inorganic compounds, copper sulfate, chromium sulfide, silicate compounds, metal oxides such as titanium oxide, vanadium oxide, manganese oxide, iron oxide, cobalt oxide and tungsten oxide, hydroxides and sulfates of these metals, etc.

Furthermore, coloring elements, especially dyes capable of absorbing infrared rays or near infrared rays can be preferably used. Especially preferable coloring elements include the coloring elements, especially dyes based on cyanine, phthalocyanine, naphthalocyanine, dithiol metal complex, azulenium, squarylium, croconium, azo disperse coloring elements, bisazo, bisazostilbene, naphthoquinone, anthraquinone, perylene, polymethine, indoaniline metal complex dyes, intermolecular CT, benzothiopyran, spiropyran, Nigrosine, thioindigo, nitroso, quinoline, fulgide, etc.

Among these dyes and pigments, those higher in molar extinction coefficient (ε) are preferable. Those of $1\times10^4$ or more in ε are preferable, and those of $1\times10^5$ or more in ε are more preferable. If ε is less than $1\times10^4$, the sensitivity improving effect is less likely to be manifested. If a dye with a high molar extinction coefficient is used, the laser beam is efficiently absorbed on the incident side of the heat sensitive layer, and the laser beam is less likely to reach the bottom of the heat sensitive layer. So, only the surface zone of the heat sensitive layer is thermally modified, and most of the heat sensitive layer is likely to remain as a result.

Among the above dyes and pigments, dyes based on cyanine, polymethine or napthalocyanine are especially preferable in view of laser beam absorbing rate, etc.

In this invention, any one of the light-heat converting substances provides the sensitivity improving effect, but if two more of them are used together, the sensitivity can also be further improved. It is preferable that the content of the light-heat converting substances is 2 to 70 wt % based on the weight of the entire heat sensitive layer composition. A more preferable range is 3 to 60 wt %. If smaller than 2 wt %, the sensitivity improving effect is small, and if larger than 70 wt %, the durability of the printing plate is likely to decline.

<(B) A Compound Capable of Causing Reaction by Heat for Improving the Dissolvability or Swelling Rate>

The reactions of the surface zone of the heat sensitive layer (the interface of the heat sensitive layer on the ink repellent layer side) by the heat generated by laser beam irradiation include molecular reduction or decomposition of the compounds in the surface zone of the heat sensitive layer, scission of crosslinked structure, change of chemical structure, destruction of hydrogen bonds, thermal fusion, acid generation, amine generation, generation of low molecular component, gas generation, structural change, etc. However, a compound like a nitro compound cannot be used since it is destroyed by self oxidation, to cause reaction in the entire heat sensitive layer.

The above reactions improve the dissolvability of the surface zone of the heat sensitive layer in the organic solvent, or enhances the swelling rate thereof, to allow the ink repellent layer to be removed by development at the laser beam irradiated area.

To cause such reactions, a compound having such capabilities can be used as the compound (A) capable of absorbing a laser beam for generating heat, or can also be used additionally. The other compound can be any of novolak resins or resol resins obtained by the condensation reaction between a phenol such as phenol, cresol or xylenol and formaldehyde, phenol.furfural resins, furan resins, etc. used in combination with any of polyfunctional blocked isocyanates, polyfunctional epoxy compounds, polyfunctional acrylate compounds, metal chelate compounds, polyfunctional aldehydes, polyfunctional mercapto compounds, polyfunctional alkoxysilyl compounds, polyfunctional amine compounds, polyfunctional carboxylic acids, polyfunctional vinyl compounds, polyfunctional diazonium salts, polyfunctional azide compounds, hydrazine, etc.

Above all, the most preferable mode is a combination of a metal-containing organic compound (B1) and an active hydrogen-containing compound (B2). The metal-containing organic compound and the active hydrogen-containing compound cause a crosslinking reaction by heating at a low temperature, though depending on the compounds used, and the crosslinked structure is easily broken by the high temperature heat generated by the applied laser beam. Therefore, if the heat sensitive layer composition is cured at a low temperature of 80° C. to 200° C. when it is applied, to crosslink both the compounds beforehand, they become compounds having bonds likely to be broken by the heat generated by the applied laser beam.

The above metal-containing organic compound (B1) consists of a central metal and an organic substituent group, and refers to a complex compound in which the organic substituent group is coordinate-bonded to the metal, or a metal chelate compound or an organic metal compound in which the organic substituent group is covalent-bonded to the metal. Any inorganic compound such as a metal oxide is not considered as a metal-containing organic compound. A metal-containing organic compound has a feature that it forms a crosslinked structure with an active hydrogen-containing compound. The metals which can be used as the central metal include the metals and semiconductor atoms of the 2nd period to the 6th period of the periodic table, and above all, the metals and semiconductor atoms of the 3rd period to the 5th period are preferable. Among them, Al and Si as metals of the 3rd period, Ti, Mn, Fe, Co, Ni, Cu, Zn and Ge as metals of the 4th period, In, Sn and Zr as metals of the 5th period and Hf of the 6th period are especially preferable, though the present invention is not limited thereto or thereby.

The compounds which can be used as the above metal-containing organic compounds (B) are enumerated below.

(B1-1) Metal Diketonates

In a metal diketonate, the hydrogen atom group of the enol hydroxyl group of the diketone is substituted by a metal atom, and the central metal is connected through an oxygen atom. Since the carbonyl oxygen atom on the non-enol side of the diketone is further coordinate-bonded to the metal, the compound is relatively stable. Particular metal diketonates include metal pentanedionates (metal acetates) having 2,4-pentanedione (popular name acetylacetone), fluoro-2,4-pentanedione, 2,2,6,6-tetramethyl-3,5-heptanedione, benzoylacetone, thenoyltrifuloroacetone or 1,3-diphenyl-1,3-propanedione, etc. as the organic substituent group, and metal acetoacetates having methylacetoacetate, ethylacetoacetate, methacryloxyethylacetoacetate or allylacetoacetate, etc. as the organic substituent group.

(B1-2) Metal Alkoxides

A metal alkoxide refers to a compound in which an alkyl group (or aryl group) is bonded to the central metal through an oxygen atom. The metal alkoxides which can be used here include those having a methoxy group, ethoxy group, propoxy group, butoxy group, phenoxy group, allyloxy group, methoxyethoxy group or aminoethoxy group, etc. as the organic substituent group.

(B1-3) Alkylmetals

In an alkylmetal, the central metal directly has an alkyl group. In this case, the metal is bonded to a carbon atom.

(B1-4) Metal Carboxylates

The metal carboxylates which can be used here include metal acetates, metal lactates, metal acrylates, metal methacrylates, metal stearates, etc.

(B1-5) Others

The others which can be used here include metal oxide chelate compounds such as titanium oxide mono(2,4-pentanedionate), metal complexes such as titanocene phenoxide, hetero metal chalete compounds having atoms of two or more metals in one molecule.

Among the above, metal diketonates (B1-1) are most preferable.

The metal-containing organic compounds are classified in reference to the organic substituent group in the above. A compound having two or more organic substituent groups such as titanium (IV) dibutoxide bis(2,4-pentanedionate) can also be used, and in view of control of dissolvability and reactivity, rather a compound having dissimilar organic substituent groups may be better.

Among the metal-containing organic compounds, those preferably used are enumerated below, though this invention is not limited thereto or thereby.

Organic aluminum compounds such as aluminum isopropylate, aluminum sec-butoxide diisopropylate, aluminum sec-butyrate, aluminum ethylacetate diisopropylate, aluminum propylacetate diisopropylate, aluminum butylacetate diisopropylate, aluminum heptylacetate diisopropylate, aluminum hexylacetate diisopropylate, aluminum octylacetate diisopropylate, aluminum ethylacetate diethylate, aluminum ethylacetate dibutyrate, aluminum ethylacetate diheptylate, aluminum ethylacetate dinonylate, aluminum diethylacetate isopropylate, aluminum tris(ethylacetate), aluminum tris(propylacetoacetate), aluminum tris(butylacetoacetate), aluminum tris(hexylacetoacetate), aluminum tris(nonylacetoacetate), aluminum tris(2,4-pentanedionate), aluminum mono(2,4-pentanedionate) bis(ethylacetoacetate), aluminum bis(2,4-pentanedionate) ethylacetoacetate, aluminum mono(2,4-pentanedionate) bis(butylacetoacetate), aluminum mono(2,4-pentanedionate) bis(hexylacetoacetate), aluminum mono(ethylacetoacetate) bis(propylacetoacetate), aluminum mono(ethylacetoacetate) bis(butylacetoacetate), aluminum mono(ethylacetoacetate) bis(hexylacetoacetate), aluminum mono(ethylacetoacetoacetate) bis(nonylacetoacetate), aluminum dibutoxide mono(acetoacetate), aluminum dipropoxide monoacetoacetate, aluminum dibutoxide mono(ethylacetoacetate), aluminum oxide acrylate, aluminum oxide octate, aluminum oxide stearate, trisalizarine aluminum, aluminum sec-butoxide bis(ethylacetoacetate), aluminum di-sec-butoxide ethylacetoacetate, aluminum diisopropoxide 9-octadecenyl acetoacetate, aluminum phenoxide, aluminum acrylate, aluminum methacrylate, and aluminum stearate.

Organic titanium compounds such as isopropyltriisostearoyl titanate, isopropyltri-n-stearoyl titanate, isopropyltrioctanoyl titanate, isopropyltridodecylbenzenesulfonyl titanate, isopropyltris(dioctyl pyrophosphite) titanate, tetraisopropylbis(dioctyl phosphite) titanate, tetraoctylbis(ditridecyl phosphite) titanate, tetrakis(2,2-diallyloxymethyl-1-butyl)bis(di-tridecyl) phosphite titanate, bis(dioctyl pyrophosphate) oxyacetate titanate, bis(dioctyl pyrophosphate)ethylene titanate, tris(dioctyl pyrophosphate) ethylene titanate, isopropyldimethacrylisostearoyl titanate, isopropylisostearoyldiacryl titanate, isopropyltri(dioctyl phosphate) titanate, isopropyltricumylphenyl titanate, isopropyltris(N-aminoethylaminoethyl) titanate, dicumylphenyl oxyacetate titanate, diisostearoylethylene titanate, isopropyldiisostearoylcumylphenyl titanate, isopropyldistearoylmethacryl titanate, isopropyldiisostearoylacryl titanate, isopropyl-4-aminobenzenesulfonylbis(dodecylbenzenesulfonyl) titanate, isopropyltrimethyacryl titanate, isopropyldi(4-aminobenzoyl)isostearoyl titanate, isopropyltris(dioctyl pyrophosphate) titanate, isopropyltriacryl titanate, isopropyltris(N,N-dimethylamino) titanate, isopropyltrianthranyl titanate, isopropyloctyl, butyl pyrophosphate titanate, isopropylbis(butyl, methyl pyrophosphate) titanate, tetraisopropylbis(dilauroyl phosphite) titanate, diisopropyl oxyacetate titanate, isostearoylmethacryl oxyacetate titanate, isostearoylacryl oxyacetate titanate, bis(dioctyl phosphate) oxyacetate titanate, 4-aminobenzenesulfonyldodecylbenzenesulfonyl oxyacetate titanate, dimethacryl oxyacetate titanate, dicumyl phenolate oxyacetate titanate, 4-aminobenzoylisostearoyl oxyacetate titanate, diacryl oxyacetate titanate, bis(octyl, butyl pyrophosphate) oxyacetate titanate, isostearoylmethacryl-ethylene titanate, bis(dioctyl phosphate)ethylene titanate, 4-aminobenzenesulfonyldodecylbenzenesulfonylethylene titanate, dimethacrylethylene titanate, 4-aminobenzoylisostearoylethylene titanate, diacrylethylene titanate, dianthranylethylene titanate, bis(butyl, methyl pyrophosphate)ethylene titanate, titanium allylacetoacetate triisopropoxide, titanium bis(triethanolamine) diisopropoxide, titanium di-n-butoxide bis(2,4-pentanedionate), titanium diisopropoxide bis (tetramethylheptanedionate), titanium diisopropoxide bis (ethyl acetoacetate), titanium methacryloxyethyl acetoacetate triisopropoxide, titanium methyl phenoxide, titanium oxide bis(2,4-pentanedionate) and titanium tetrabutoxide.

Organic iron compounds such as dibenzoylmethane iron (II), tropolone iron, tristropolonoiron (III), hinokitiol iron, trishinokitioloiron (III), acetoacetate iron (III), iron (III) tris(benzoylacetonate), iron (III) tris(2,4-pentanedionate) and iron (III) tris(fluoropentanedionate).

Organic copper compounds such as salicylaldehyde copper (II), copper (II) bis(2,4-pentanedionate), salicylaldehydeimine copper, copper kojate, biskojatocopper (II), tropolone copper (II), bistropolonocopper (II), bis(5-oxynaphthoquinone-1,4) copper, acetoacetate copper, salicylamine copper, o-oxyazobenzene copper, copper (II) bis (benzoylacetate), copper (II) bis(ethylacetoacetate), copper (II) methacryloxyethyl acetoacetate, copper (II) bis (methoxyethoxyethoxide), copper (II) bis(2,4-pentanedionate) and copper (II) bis(2,2,6,6-tetramethyl-3,5-heptanedionate).

Organic zinc compounds such as zinc bis(N,N-dimethylaminoethoxide), zinc bis(2,4-pentanedionate) and zinc bis(2,2,6,6-tetramethyl-3,5-heptanedionate).

Other metal-containing organic compounds such as cobalt (III) tris(2,4-pentanedionate), salicylaldehyde cobalt, o-oxyacetophenone nickel, bis(1-oxyxanthone) nickel, nickel pyromeconate, salicyladehyde nickel, allyl triethyl germane, allyl trimethyl germane, ammonium tris(oxalate) germanate, bis{bis(trimethylsilyl)amino}germanium (II), carboxyethylgermanium sesquioxide, cyclopentadienyl trimethyl germane, di-n-butyl diacetoxy germane, di-n-butyl dichlorogermane, dimethyl aminotrimethyl germane, diphenyl germane, hexaallyl digermanoxane, hexaethyl digermanoxane, hexaphenyl digermanoxane, hexamethyl digermane, hydroxygermatrane monohydrate methacryloxytriethyl germane, tetraallyl germane, tetra-n-butoxy germane, tetraisopropoxy germane, tetra-n-butyl germane, tri-n-butylacetoxy germane, tetra-n-tolyl germane, triethyl germane, triethylmethoxy germane, triphenyl germane, vinyltriethyl germane, di-n-butylbis(2,4-pentanedionate) tin, allyltri-n-butyltin, bis(2-ethylhexanoate) tin, di-n-butyldiacetoxytin, calcium bis(2,4-pentanedionate), cerium (III) tris(2,4-pentanedionate), europium tris(2,4-pentanedionate), europium (III) tris (thenoyltrifluoroacetonate), indium tris (2,4-pentanedionate), manganese (II) bis(2,4-pentanedionate) and manganese (III) tris(2,4-pentanedionate).

Among these examples, especially preferably used metal-containing organic compounds are compounds having aluminum, iron (III) or titanium as the central metal and acetylacetonate (2,4-pendanedionate), 3,5-heptanedionate, 2,2,6,6-tetramethyl-3,5-heptanedionate, ethylacetoacetate, benzoylacetonate, isopropoxide or n-butoxide as the organic substituent group. For one metal, one organic substituent group may be coordinated or bonded or two or more dissimilar organic substituent groups may be coordinated or bonded.

Any one of these metal-containing organic compounds (B1) can be used, or two or more of them as a mixture can also be used. It is preferable, in view of the crosslinking degree of the heat sensitive layer and the sensitivity of the printing plate, that the content of the metal-containing organic compound is 1 to 200 parts by weight per 100 parts by weight of the active hydrogen-containing compound (B2) described below. A more preferable range is 5 to 150 parts by weight.

The compounds which can be used as the active hydrogen-containing compound (B2) include hydroxyl group-containing compounds, carboxyl group-containing compounds and anhydrides thereof, primary and secondary amines, etc. It is preferable that the active hydrogen-containing compound is bifunctional or higher polyfunctional, since the number of crosslinking bonds with the metal-containing organic compound affects the solvent resistance of the heat sensitive layer and the sensitivity of the printing plate.

(B2-1) Hydroxyl Group-containing Compounds

Either a phenolic hydroxyl group-containing compound or an alcoholic hydroxyl group-containing compound can be used in this invention. The phenolic hydroxyl group-containing compounds which can be used here include hydroquinone, catechol, resorcinol, pyrogallol, phloroglycinol, guaiacol, cresol, xylenol, naphthol, dihydroxyanthraquinone, dihydroxybenzophenone, trihydroxybenzophenone, tetrahydroxybenzophenone, bisphenol A, bisphenol S, resol resin, phenol formaldehyde novolak resins, resorcinbenzaldehyde resin, pyrogallolacetone resin, hydroxystyrene homopolymer and copolymers, rosin modified phenol resins, aniline modified phenol resins, epoxy modified phenol resins, lignin modified phenol resins, melamine modified phenol resins, etc. The alcoholic hydroxyl group-containing compounds which can be used here include ethylene glycol, diethylene glycol, triethylene glycol, tetraethylene glycol, polyethylene glycol, propylene glycol, dipropylene glycol, polypropylene glycol, 1,3-butanediol, 1,4-butanediol, hexanediol, octanediol, nonanediol, decanediol, 2-butene-1,4-diol, 5-hexene-1,2-diol, 7-octene-1,2-diol, 3-mercapto-1,2-propanediol, glycerol, diglycerol, trimethylolpropane, 1,2,4-butanetriol, pentaerythritol, dipentaerythritol, sorbitol, sorbitan, polyvinyl alcohol, cellulose and derivatives thereof, epoxy (meth) acrylate and homopolymer and copolymers thereof, reaction products of epoxy resins, esterification products between rosin modified maleic acid resin and a polyfunctional hydroxyl group-containing compound, esterification products between poly(meth)acrylic acid and a polyfunctional hydroxyl group-containing compound, etc.

(B2-2) Carboxyl Group-containing compounds

These compounds include homopolymers and copolymers of ethylenic unsaturated monocarboxylic acids such as acrylic acid, methacrylic acid, oleic acid, cinnamic acid, crotonic acid, isocrotonic acid, angelic acid, tiglic acid, elaidic acid and atropic acid, saturated dicarboxylic acids such as tartronic acid, oxalic acid, malonic acid, succinic acid, glutaric acid, adipic acid, suberic acid, azelaic acid, sebacic acid, tartaric acid, malic acid, galactaric acid, pimelic acid, pinic acid, homopinic acid, cyclohexanediacetic acid, anthraquinonedicarboxylic acid, citric acid and phthalic acid, and anhydrides thereof, homopolymers and copolymers of ethylenic unsaturated dicarboxylic acids such as maleic acid, fumaric acid, itaconic acid, muconic acid and 1,4-(2-norbornene)dicarboxylic acid, and anhydrides thereof, rosin modified maleic acid resin, etc. Polyesters obtained by letting any of these polyfunctional carboxylic acids with any of polyols can also be used. Monofunctional compounds containing a hydroxyl group or amine can also be used. They include hydroxycarboxylic acids such as tropic acid, glycollic acid, glyceric acid, lactic acid, salicylic acid, vanillic acid, mandelic acid, protocatechuic acid, gallic acid and benzilic acid, and aminocarboxylic acids such as anthranilic acid, aminobenzoic acid, aminobutyric acid, aminocaproic acid and aminocaprylic acid. Polymers obtained by dehydrating and condensing any of these hydroxycarboxylic acids and aminocarboxylic acids can also be used.

Any one of these active hydrogen-containing compounds (B2) can be used, and similar or dissimilar ones of them can also be used together. It is preferable that the content of the active hydrogen-containing compound (B2) is 5 to 80 wt % based on the weight of the entire heat sensitive layer composition. A more preferable range is 20 to 60 wt %. If the content is less than 5 wt %, the sensitivity of the printing plate declines, and if more than 80 wt %, the solvent resistance of the printing plate is likely to decline.

As the compound (B) capable of causing reaction by heat for improving the dissolvability or swelling rate, a combination comprising a metal-containing organic compound and a phenol resin is most preferable.

<(C) Thermosetting Compound>

The heat sensitive layer may also contain a thermosetting compound (C) in addition to the above compound (A) capable of absorbing a laser beam for generating heat and the compound (B) capable of causing reaction by heat for improving the dissolvability or swelling rate. The thermosetting compound in this invention refers to a compound capable of being thermoset directly or indirectly by the action of laser beam irradiation in the heat sensitive layer of the printing plate precursor. It is preferable that a thermosetting compound is added to the heat sensitive layer of this invention, since the heat sensitive layer is thermoset at the bulk area by the heat generated by laser beam irradiation and is likely to remain.

The thermosetting resins which can be used here include novolak resins and reson resins obtained by the condensation reaction between a phenol such as phenol, cresol or xylenol and formaldehyde, phenolfurfural resins, furan resins, unsaturated polyesters, alkyd resins, urea resin, melamine resin, guanamine resin, epoxy resins, diallyl phthalate resin, unsaturated polyurethane resins, polyimide precursors, etc.

In addition to the above resins which cause self-reaction, a compound obtained by adding a thermoreactive crosslinking agent to a compound having a reactive functional group can also be used as the thermosetting compound (C) in this invention. The crosslinking agent refers to a polyfunctional compound having crosslinkability. The crosslinking agents which can be used here include polyfunctional blocked isocyanates, polyfunctional epoxy compounds, polyfunctional acrylate compounds, polyfunctional aldehydes, polyfunctional mercapto compounds, polyfunctional alkoxysilyl compounds, polyfunctional amine compounds, polyfunctional carboxylic acids, polyfunctional vinyl compounds, polyfunctional diazonium salts, polyfuctional azide compounds, hydrazine, etc.

Furthermore, a compound capable of generating an acid or amine by the action of heat and a compound capable of being cured by the action of the generated acid or amine can also be used in this invention.

When the thermosetting compound is contained, it is preferable that the thermoseting compound content in the heat sensitive layer is 10 to 95 wt % based on the weight of the total solid content of the heat sensitive layer. A more preferable range is 30 to 70 wt %. If the thermosetting compound is smaller than 10 wt %, the effect of improving the solvent resistance of the heat sensitive layer at the image area by thermosetting may be poor. On the other hand, if larger than 95 wt %, the contents of the thermally decomposable compound and the light-heat converting substance become relatively smaller, and the image formability by laser beam irradiation may be insufficient.

The combination comprising any of the metal-containing organic compounds (B1) and any of the active hydrogen-containing compounds (B2) enumerated in the above (B) partially acts also as the thermosetting compound (C). Among the compounds (B1), a metal chelate compound which has two or more donor atoms irrespective of whether the ligand is similar or dissimilar and forms a ring containing a metal atom, for example, a metal diketonate (B1-1) can be preferably used. Such a compound is excellent in the stability of the compound itself and in the stability of the heat sensitive layer solution. So, at the time of curing in the production of the printing plate, the 2,4-pentanedione of the metal diketonate is unlikely to be dissociated. Therefore, in the heat sensitive layer of the printing plate precursor, the metal diketonate and the active hydrogen-containing compound (B2) remain unreactive, and keep a capability of being able to be thermoset directly or indirectly by the action of laser beam irradiation. On the contrary, the metal alkoxide (B1-2) is highly reactive and easily forms a crosslinked structure with the active hydrogen-containing compound (B2) and often already loses the capability of being thermoset by the action of laser beam irradiation in the heat sensitive layer of the printing plate precursor. So, it does not usually act as one component of (C). A metal diketonate alkoxide have both the natures and causes two step reactions; i.e., crosslinkingreaction in low temperature curing and thermosetting reaction at the time of laser beam irradiation.

As described in the paragraphs of (B) and (C), a metal-containing organic compound can function as both a decomposable compound and a crosslinking agent, and may also act as a catalyst of the thermosetting reaction. Also when the metal-containing organic compound functions as both a decomposable compound and a crosslinking agent, the heat sensitive layer may further contain any of the decomposable compounds described above or any of the crosslinking agents as described above.

It is preferable that the content of the metal-containing organic compound in the heat sensitive layer is 0.5 to 50 wt % of the total solid content of the heat sensitive layer. A more preferable range is 3 to 30 wt %. If the organic complex compound content is smaller than 0.5 wt %, the effects as described above cannot be expected, and if larger than 50 wt % on the other hand, problems such as the decline in the durability of the printing plate occur.

<Other Ingredients>

It is preferable that the heat sensitive layer contains a silyl group-containing compound. If the heat sensitive layer contains a silyl group-containing compound, the adhesion between the heat sensitive layer and the underlying substrate or heat insulating layer can be enhanced, and the adhesion to the overlying silicone rubber layer is stably manifested to provide high durability. The silyl group-containing compound in this invention refers to a compound having a structure represented by the following general formula (II).

$$—SiR_nX_{(3-n)} \qquad (II)$$

(where n denotes an integer of 0 to 3; R denotes an alkyl group, alkenyl group, aryl group or a group having these groups combined, which may have a functional group such as a halogen atom, isocyanato group, epoxy group, amino group, hydroxy group, alkoxy group, aryloxy group, (meth) acryloxy group or mercapto group, etc. as a substituent group; and X denotes a functional group such as a hydrogen atom, hydroxyl group, alkoxy group, acyloxy group, ketoximino group, amido group, aminoxy group, amino group or alkenyloxy group.)

Groups with the structure represented by the general formula (II) include an alkoxysilyl group, acetoxysilyl group, ketoximinosilyl group, trimethylsiloxy group, triethylsiloxy group, triphenylsiloxy group, etc. Among them, an alkoxysilyl group, acetoxysilyl group and ketoximinosilyl group are preferable.

It is preferable that the silyl group-containing compound (D) used in this invention further has a functional group such as a hydroxyl group, amino group, unsaturated group, mercapto group or epoxy group. The compound (D) is especially preferable to have a hydroxyl group or unsaturated group. Such a functional group can be used, for example, for manifesting the adhesion between the silicone rubber layer and the heat sensitive layer, manifesting the adhesion between the heat sensitive layer and the substrate or heat insulating layer, and forming a crosslinked structure in the heat sensitive layer. The reaction which can be used for manifesting the adhesion between the silicone rubber layer and the heat sensitive layer is, for example, the reaction between the hydroxyl groups in the heat sensitive layer and a condensation type silicone rubber crosslinking agent, the reaction between the unsaturated groups in the heat sensitive layer and the SiH groups in an addition type silicone rubber, or the reaction between the hydroxyl groups in the heat sensitive layer and the SiH groups in an addition type silicone rubber, etc. The reaction which can be used for forming a crosslinked structure in the heat sensitive layer is, for example, the reaction between the hydroxyl groups in the heat sensitive layer and a polyisocyanate, epoxy resin, polyamine, amine derivative, polycarboxylic acid, carboxylic acid derivative such as carboxylic acid chloride or metal-containing compound, the ene.thiol addition by unsaturated groups and a polythiol compound, or the thermal induced radical or photoradical polymerization of unsaturated groups, etc.

Any one or more as a mixture of these silyl group-containing compounds can be used. It is preferable that the content of the silyl group-containing compound is 1 to 30 wt % based on the weight of the overall heat sensitive layer composition. A more preferable range is 2 to 25 wt %. If the content is smaller than 1%, the effect of improving the durability is small, and if larger than 30%, the sensitivity of the printing plate is likely to decline.

To improve the durability and the solvent resistance of the printing plate, it is recommended to let the heat sensitive layer contain a binder polymer. The binder polymer is not especially limited as far as it is soluble in an organic solvent and can form a film, but to make the heat sensitive layer flexible in view of the durability of the printing plate, it is preferable to use a homopolymer or copolymer with a glass transition temperature (Tg) of 20° C. or lower, and it is more preferable to use a homopolymer or copolymer with a glass transition temperature of 0° C. or lower. The binder polymers which can be used here include vinyl polymers, unvulcanized rubbers, polyoxides (polyethers), polyesters, polyurethanes, polyamides, etc.

Any one or more as a mixture of these binders can be used. It is preferable that the binder content is 5 to 70 wt % based on the weight of the entire heat sensitive layer composition. A more preferable range is 10 to 50 wt %. If the content is smaller than 5%, the durability and the coating solution applicability are likely to be adversely affected, and if larger than 70 wt %, the image reproducibility is likely to be adversely affected.

In addition to the above ingredients, the heat sensitive layer may contain, as required, arbitrarily a dye, acid, leveling agent, surfactant, color coupler, plasticizer, etc.

The composition used to form the heat sensitive layer is dissolved into a proper organic solvent such as dimethylformamide, methyl ethyl ketone, methyl isobutyl ketone, dioxane, toluene, xylene, ethyl acetate, butyl acetate, isobutyl acetate, isoamyl acetate, methyl propionate, ethylene glycol monomethyl ether, ethylene glycol dimethyl ether, ethylene glycol monoethyl ether, ethylene glycol diethyl ether, acetone, methanol, ethanol, cyclopentanol, cyclohexanol, diacetone alcohol, benzyl alcohol, butyl butyrate or ethyl lactate, to prepare a composition solution. The composition solution is applied uniformly onto a substrate and cured at a necessary temperature for a necessary time, to form the heat sensitive layer.

It is preferable that the thickness of the heat sensitive layer is 0.1 $g/m^2$ to 10 $g/m^2$. A more preferable range is 0.2 $g/m^2$to 5 $g/m^2$. If the thickness is less than 0.1 $g/m^2$, the durability is likely to decline, and a thickness of more than 10 $g/m^2$ is economically disadvantage.

It is preferable that the light transmittance, in the heat sensitive layer of this invention, of the light with the same wavelength as that of the applied laser beam is less than 20%. More preferable is less than 10%. If the light transmittance in the heat sensitive layer is less than 20%, the light transmitted through the entire heat sensitive layer can be lessened to allow an effective reaction to be effected in the surface zone of the heat sensitive layer. Furthermore, since the light transmitted through the entire heat sensitive layer can be lessened, the extra reaction of the heat sensitive layer by reflection of energy from the lower zone of the heat sensitive layer can be inhibited.

<Ink Repellent Layer>

It is preferable that the directly imageable waterless planographic printing plate precursor used in this invention has a silicone rubber layer as an ink repellent layer. For the silicone rubber layer, either addition polymerization type or condensation polymerization type can be used. The silicone rubber layer can be obtained by sparsely crosslinking a linear organopolysiloxane (preferably dimethylpolysiloxane). A typical silicone rubber has a repeating unit represented by the following formula (III).

$$(-SiR_2-O)_n- \qquad (III)$$

(where n denotes an integer of 2 or more; and R denotes a substituted or non-substituted alkyl group with 1 or more carbon atoms, alkenyl group with 1 or more carbon atoms, aryl group with 1 or more carbon atoms or a group with these groups combined: it is preferable that 40% or less of all the groups denoted by R are vinyl groups, phenyl groups, vinyl halide groups or phenyl halide groups, and that 60% or more of all the groups denoted by R are methyl groups.)

For the silicone rubber layer applied for the printing plate of this invention, a silicone rubber (RTV or LTV silicone rubber) which can be crosslinked by condensation as described below can be used. As the silicone rubber, an organopolysiloxane with some of groups R of its chains substituted by H can be used, and crosslinked by the condensation of a hydroxyl group-containing organopolysiloxane and a crosslinking agent represented by (IV) (de-acetic-acid type, de-oxime type, de-alcohol type, de-amine type, de-acetone type, de-amide type or de-aminoxy type, etc.). Furthermore, the crosslinking agent may be allowed to exist by an excessive amount.

$$R_{4-n}SiY_n \quad (IV)$$

(in the above formula (IV), R is as defined in the formula (III); Y denotes a hydrolyzable functional group selected from halogen atom, acyloxy group, ketoxyimino group, alkoxy group, amido group, aminoxy group and alkenyloxy group; and n denotes an integer of 2 to 4.)

The hydroxyl groups of the hydroxyl group-containing polydimethylsiloxane can be positioned at the molecular ends and/or in the main chain. A preferably used polydimethylsiloxane has hydroxyl groups at the molecular ends. As for the molecular weight, a polydimethylsiloxane with a molecular weight of thousands to hundreds of thousands can be used, but in view of handling convenience, the ink repellency, flaw resistance (scratch property), etc. of the obtained printing plate, etc., it is preferable to use a polydimethylsiloxane with a weight average molecular weight of 10,000 to 200,000. A more preferable range is 30,000 to 150,000.

The crosslinking agents which can be used in the polycondensation type silicone rubber layer include acetoxysilanes, alkoxysilanes, ketoximinosilanes, allyloxysilanes, etc. represented by the general formula (IV). In the above formula, it is preferable that the number n of the hydrolyzable functional groups Y is 3 or 4.

The preferable compounds which can be used here include methyltriacetoxysilane, ethyltriacetoxysilane, vinyltriacetoxysilane, vinyltris(methylethylketoximino) silane, tetrakis(methylethylketoximino)silane, etc., though not limited to them.

It is preferable that the added amount of the crosslinking agent represented by the general formula (IV) is 1.5 to 20 wt % based on the weight of the entire composition of the silicone rubber layer. A more preferable range is 3 to 10 wt %. As for the quantitative ratio of the crosslinking agent to the polydimethylsiloxane, it is preferable that the molar ratio of functional groups Y/hydroxyl groups of the polydimethylsiloxane is 1.5 to 10.0. If the molar ratio is 1.5 or more, it does not happen that the silicone rubber layer solution is gelled, and if 10.0 or less, it does not happen that the rubber becomes physically brittle or that the flaw resistance, etc. of the printing plate are adversely affected.

When such a silicone rubber to be crosslinked by condensation is used, an acid, alkali, amine, metal alkoxide, metal diketonate or organic acid salt of a metal can be added as a catalyst. Among them, it is preferable to add an organic acid of a metal, and it is especially preferable to add an organic acid salt of a metal selected from tin, lead, zinc, iron, cobalt, calcium and manganese. The particular compounds which can be used here include dibutyltin dilaurylate, tin (II) octoate, dibutyltin diacetate, naphthanate salts, chloroplatinic acid, etc.

It is preferable that the curing catalyst content is 0.01 to 20 wt % as the solid content in the silicone rubber layer. A more preferable range is 0.1 to 10 wt %. If the added amount of the catalyst is 0.01 wt % or more, it does not happen that the silicone rubber layer is cured insufficiently, and furthermore, no problem arises in the adhesion to the heat sensitive layer. On the other hand, if 20 wt % or less, the pot life of the silicone rubber layer solution is not adversely affected.

The silicone rubber layer can arbitrarily contain a filler such as silica for improving the rubber strength, in addition to the above ingredients.

Moreover, in this invention, apart from the above condensation type silicone rubber, an addition type silicone rubber can also be used. As the addition type silicone rubber, a silicone rubber obtained by crosslinking and curing a hydrogenpolysiloxane having Si—H bonds and a vinylpolysiloxane having CH═CH bonds using a platinum based catalyst as described below can be preferably used.

(1) An organopolysiloxane having at least two alkenyl groups (preferably vinyl groups) directly bonded to silicone atoms in one molecule: 100 parts by weight (2) An organohydrogenpolysiloxane having at least two SiH groups in one molecule: 0.5 to 1000 parts by weight (3) An addition catalyst: 0.001 to 15 parts by weight The alkenyl groups of the ingredient (1) can exist at the ends or intermediate positions of each molecular chain, and the other organic groups than alkenyl groups are substituted or non-substituted alkyl groups or aryl groups. The ingredient (1) can also have hydroxyl groups (SiH groups) by a slight amount. As for the molecular weight, an organopolysiloxane with a molecular weight of thousands to hundreds of thousands can be used, but in view of handling convenience, the ink repellency, flaw resistance (scratch property), etc. of the obtained printing plate, etc., it is preferable to use an organopolysiloxane with a weight average molecular weight of 10,000 to 200,000. A more preferable range is 30,000 to 150,000. The ingredient (2) reacts with the ingredient (1), to form a silicone rubber, and also functions to allow the adhesion to the heat sensitive layer. The hydrogen groups of the ingredient (2) can be positioned at the ends or intermediate positions of each molecular chain, and the other organic groups than hydrogen can be selected from those enumerated for the ingredient (1). As the organic groups of the ingredients (1) and (2), in view of higher ink repellency, it is preferable that 60% or more of the groups are methyl groups. The molecular structures of the ingredients (1) and (2) can be any of straight chain, cycle or branched chain, and in view of physical properties of the rubber, it is preferable that the molecular weight of at least either of the ingredients is more than 1000. It is more preferable that the molecular weight of the ingredient (2) is more than 1000. The hydrogensiloxane as the ingredient (2) cures the silicone rubber by crosslinking with the alkenyl groups of the ingredient (1), and also reacts with the vinyl groups and hydroxyl groups in the heat sensitive layer, for achieving the adhesion between the silicone rubber layer and the heat sensitive layer. For this reason, it is preferable that the Si—H groups of the ingredient (2) are contained excessively, particularly by 1.5 to 30 equivalents for each equivalent of the alkenyl groups of the ingredient (1). A more preferable range is 5 to 20 equivalents. If the functional group ratio of the Si—H groups to the alkenyl groups is 1.5 or more, it does not happen that the silicone rubber layer is cured insufficiently, and if 30 or less, it does not happen that the rubber becomes physically birttle to adversely affect the flaw resistance, etc. of the printing plate.

The ingredient (1) can be α,ω-divinylpolydimethylsiloxane or (methylvinylsiloxane) (dimethylsiloxane) copolymer with methyl groups at both the ends, etc. The ingredient (2) can be polydimethylsiloxane with hydrogen groups at both the ends, α,ω-dimethylpolymethylhydrogensiloxane, (methylhydrogensiloxane) (dimethylsiloxane) copolymer with methyl groups at both the ends, or cyclic polymethylhydrogensiloxane, etc. The addition catalyst as the ingredient (3) can be arbitrarily selected from those generally used, and especially a platinum based compound is preferable. Preferable platinum based compounds which can be used here include platinum, platinum chloride, chloroplatinic acid, olefin-coordinated platinum, alcohol modified complex of platinum, methylvinylpolysiloxane complex of platinum, etc.

The composition comprising these ingredients (1) to (3) causes addition reaction to start curing when the three ingredients are mixed. It is characteristic that the curing rate becomes suddenly higher with the rise of reaction temperature. So, as for the curing conditions of the composition, it is preferable in view of the stability in the bonding strength to the heat sensitive layer, to keep the temperature in a range in which the properties of the substrate and the heat sensitive layer do not change, and to keep at a high temperature till perfect curing is achieved.

It is preferable to add a reaction inhibitor to the silicone rubber layer, for extending the pot life of the composition and for controlling the curing rate. The reaction inhibitors which can be used here include nitrogen-containing compounds such as oximes and amines, phosphorus compounds, vinyl group-containing organopolysiloxanes such as tetracyclo(methylvinyl)siloxane, acetylene group-containing alcohols, acetone, methyl ethyl ketone, methanol, ethanol, propylene glycol monomethyl ether, etc. Among them, an acetylene group-containing alcohol can be preferably used.

Furthermore, for improving the adhesion to the heat sensitive layer, it is also effective to add a silane coupling agent. In addition, a hydroxyl group-containing organopolysiloxane, which is as an ingredient for the condensation type silicone rubber layer, or a hydrolyzable functional group-containing silane (or siloxane) can also be added arbitrarily, and moreover, for improving the rubber strength, a filler such as silica can also be arbitrarily added.

It is preferable that the thickness of the silicone rubber layer is 0.5 to 50 $g/m^2$. A more preferable range is 0.5 to 10 $g/m^2$. If the thickness is smaller than 0.5 $g/m^2$, the ink repellency of the printing plate is likely to decline, and a thickness of larger than 50 $g/m^2$ is economically disadvantageous.

<Substrate>

The substrate used in the printing plate of this invention is a dimensionally stable sheet. The substrates which can be used here include paper, plastics (e.g., polyethylene, polypropylene, polystyrene, etc.), metallic sheets of zinc, copper, aluminum, etc., plastic films of cellulose, carboxymethyl cellulose, cellulose acetate, polyethylene, polyester, polyamide, polyimide, polystyrene, polypropylene, polycarbonate, polyvinyl acetate, etc., paper or plastic films having a metal laminated or vapor-deposited, etc. Among these substrates, an aluminum sheet is especially preferable since it is excellent in dimensional stability and inexpensive. Furthermore, a polyethylene terephthalate film used as a substrate for small-scale printing can also be preferably used.

<Heat Insulating Layer>

The directly imageable waterless planographic printing plate used in this invention may have a heat insulating layer formed between the substrate and the heat sensitive layer for preventing that the heat generated by the applied laser beam strays into the substrate. The primer layer usually used for intensifying the adhesion between the substrate and the heat sensitive layer can also be used as it is, as the heat insulating layer. It is important that the heat insulating layer of the directly imageable waterless planographic printing plate precursor used in this invention satisfies such conditions as being capable of well bonding the substrate and the heat sensitive layer, being stable with the lapse of time, and being resistant against the solvent of the developer.

The substances which satisfy these conditions include those containing any of the epoxy resins enumerated in Japanese Patent Publication (Kokoku) No. Sho61-54219, and also urethane resins, epoxy resins, phenol resins, acrylic resins, alkyd resins, polyester resins, polyamide resins, melamine resin, urea resin, benzoguanamine resin, vinyl chloride-vinyl acetate copolymer, polyvinyl butyral resin, polyacrylonitrile-butadiene copolymer, resol resins, polyether resins, epoxyphenol urea resin, polyether sulfone resins, milk casein, gelatin, etc. Any one or more as a mixture of these resins can be used. A substance obtained by photosetting or thermosetting a composition similar to the heat sensitive layer can also be used. Among them, it is preferable to use any one or more as a mixture of polyurethane resins, polyester resins, acrylic resin, epoxy resins, urea resin, epoxyphenol urea resin, resol resins, etc. It is preferable that the polymer content is 20 to 98 wt % based on the weight of the composition of the entire heat insulating layer. A more preferable range is 40 to 95 wt %.

Furthermore, it is preferable that the heat insulating layer contains a crosslinking agent, to impart solvent resistance. The crosslinking agent can be a combination of resins selected from the above resins, for example, an epoxy resin and an amino resin (urea resin, melamine resin or benzoguanamine resin, etc.), but can also be a combination consisting of an isocyanate compound and a hydroxyl group-containing compound.

The isocyanate compounds which can be used here include, for example, paraphenylene diisocyanate, 2,4- or 2,6-toluylene diisocyanate (TDI), 4,4-diphenylmethane diisocyanate (MDI), tolylene diisocyanate (TODI), xylylene diisocyanate (XDI), hydrogenated xylylene diisocyanate, cyclohexane diisocyanate, m-xylylene diisocyanate (MXDI), lysine diisocyanate (LDI) (also called 2,6-diisocyanatomethyl caproate), hydrogenated MDI (also called 4,4'-methylenebis(cyclohexyl isocyanate)), hydrogenated TDI (also called methylcyclohexane 2,4(2,6)-diisocyanate), hydrogenated XDI (also called 1,3-(isocyanatomethyl) cyclohexane), isophorone diisocyanate (IPI), diphenyl ether diisocyanate, trimethylhexanemethylene diisocyanate (TMDI), tetramethylxylylenediisocyanate, polymethylenephenyl isocyanate, dimer acid diisocyanate (DDI), triphenylmethane triisocyanate, tris (isocyanatophenyl) thiophosphate, tetramethylxylylene diisocyanate, lysine ester triisocyanate, 1,6,11-undecane triisocyanate, 1,8-diisocyanato-4-isocyanatomethyloctane, 1,3.6-hexamethylene triisocyanate, bicycloheptane triisocyanate, etc., higher alcohol adducts of polyisocyanates, and polymers of polyisocyanates. Blocked isocyanates obtained by blocking the above isocyanate compounds by methyl ethyl ketoxime, phenol or e-caprolactam, etc. can also be used. The compound having hydroxyl groups, which can react with any of these isocyanate compounds can be, for example, an epoxy resin, phenol resin, resol resin, hydroxyl group-containing polyurethane, acrylic resin, or hydroxyl group-containing monomer or oligomer.

It is preferable that the crosslinking agent content is 10 to 60 wt % based on the weight of the entire heat insulating layer composition. A more preferable range is 20 to 50 wt %.

Furthermore, it is arbitrarily allowed to add an acid or organic tin compound, etc. as a catalyst for promoting the reaction, or to add a surfactant for improving the coatability.

It can happen that the heat sensitive layer of the printing plate is partially peeled at the exposed area, to expose the hue of the heat insulating layer. So, it is preferable to let the heat insulating layer contain an additive such as a dye or pigment, etc. for improving the plate visual inspectability. In this case, any dye or pigment can be used as far as it is different from the heat sensitive layer in hue, but a green, blue or violet dye or pigment is preferable.

The composition used for forming the above heat insulating layer is dissolved into a proper organic solvent such as dimethylformamide, methyl ethyl ketone, methyl isobutyl ketone or dioxane, etc., to prepare a composition solution. The composition solution is uniformly applied onto a substrate, and heated at a necessary temperature for a necessary time, to form the heat insulating layer.

The heat insulating layer is not necessarily required to be formed. However, if it is formed, it is preferable that the thickness of the heat insulating layer is 0.5 to 50 $g/m^2$ as a covering layer. A more preferable range is 1 to 10 $g/m^2$. If the thickness is smaller than 0.5 $g/m^2$, the effect for avoiding the form defects of the substrate surface and chemical adverse effects is poor. A thickness of larger than 50 $g/m^2$ is economically disadvantageous.

<Cover Film>

For protecting the silicone rubber layer on the surface of the waterless planographic printing plate precursor constituted as described above, a plain thin protective film or a thin protective film roughened, for example, by depositing thereon particles of an inorganic material such as silica can be laminated on the surface of the silicone rubber layer, or a polymer coating film capable of being dissolved in a development solvent described in Japanese Patent Laid-Open (Kokai) No. Hei5-323588 can also be formed on the surface of the silicone rubber layer.

<Method of Producing a Waterless Planographic Printing Plate Precursor>

A substrate is coated with the compositions destined to form the respective layers, using an ordinary coater such as a reverse roll coater, air knife coater or Meyer bar coater, or a rotary coater such as a whirler. As required, a heat insulating layer composition is applied and cured at 100 to 300° C. for several minutes, and a heat sensitive layer composition solution is applied and cured at 50 to 180° C. for several minutes. On it, a silicone rubber layer composition solution is applied and treated at a temperature of 50 to 200° C. for several minutes, to cure the rubber. Then, as required, a protective film is laminated, or a protective layer is formed.

<Method of Producing a Waterless Planographic Printing Plate>

The method of producing a waterless planographic printing plate which allows printing by a waterless printing machine, from the directly imageable waterless planographic printing plate precursor obtained as described above comprises the following three steps in this invention; a first step of imagewisely exposing (imagewise irradiation with a laser beam), a second step of pre-treating the plate by an organic solvent (pre-treatment step), and a third step of rubbing off the ink repellent layer (development step).

<Imagewise Irradiation With a Laser Beam (First Step)>

The directly imageable waterless planographic printing plate precursor is imagewisely irradiated with a laser beam through a protective film or after removing the protective film.

The laser beam source used in this case has an emission wavelength in a range of 300 nm to 1500 nm. The lasers which can be used here include an $Ar^+$ laser, $Kr^+$ laser, He-Ne laser, He-Cd laser, ruby laser, glass laser, semiconductor laser, YAG laser, titanium sapphire laser, dye laser, nitrogen laser, metal vapor laser, etc. Among them, a semiconductor laser is more advantageous than other laser light sources in view of the smaller size and low cost achieved by the technical progress made in recent years.

<Pre-treatment Step (Second Step)>

The pre-treatment step refers to a step in which the printing plate is immersed in the pre-treatment liquid kept at a predetermined temperature, for a certain time.

If the heat sensitive layer is irradiated with a laser beam, the heat sensitive layer is modified anyway (a decomposition product is produced in the heat sensitive layer, or the solvent resistance of the heat sensitive layer changes) at the laser beam irradiated area. If the laser beam irradiation energy is raised, the degree of modification becomes larger. So, even if the development step is effected without undergoing the pre-treatment step, the silicone rubber layer can be removed at the laser beam irradiated area. However, in this case, the energy required for patterning the printing plate becomes large, and the sensitivity of the printing plate declines. Furthermore, if the heat sensitive layer is irradiated with a laser beam with very large energy, the layer is destroyed and is unlikely to remain after completion of development, and the disadvantages at the time of printing as described before are caused. On the other hand, if the irradiation energy is small, the heat sensitive layer is less modified, and it is difficult to detect the laser beam irradiated area and the laser beam non-irradiated area in the development step alone, being unlikely to allow development. So, it is necessary to pre-treat the printing plate by a pre-treatment liquid, for amplifying the difference between the laser beam irradiated area and the laser beam non-irradiated area and developing the low energy irradiated area.

If the printing plate is immersed in the pre-treatment liquid, the pre-treatment liquid permeates into the silicone rubber layer, and in time, reaches the surface of the heat sensitive layer. Since the heat sensitive layer has a thermal decomposition product generated or is improved in the dissolvability in the pre-treatment liquid in its surface zone at the irradiated area, the surface of the heat sensitive layer is swollen or partially dissolved by the pre-treatment liquid. If the printing plate surface is lightly rubbed in this state, the silicone rubber layer is removed together with the surface of the heat sensitive layer at the irradiated area, and the lower zone of the heat sensitive layer becomes bare to form an ink acceptable layer. On the other hand, since the heat sensitive layer at the non-irradiated area is insoluble or slightly soluble in the pre-treatment liquid, the silicone rubber layer strongly bonded to the heat sensitive layer is not removed even by strong rubbing. Thus, the silicone rubber layer at the non-irradiated area is not developed and becomes an ink repellent layer, to form an image on the waterless planographic printing plate.

Since the printing plate is highly sensitized by this mechanism, the selection of the pre-treatment liquid is important. If the pre-treatment liquid used is highly capable of dissolving the heat sensitive layer, the silicone rubber layer at the non-irradiated area is also removed, and depending on the degree of dissolvability, the heat sensitive layer is also removed. On the other hand, if the pre-treatment liquid used is low in the capability of dissolving the heat sensitive layer, even the silicone rubber layer at the irradiated area cannot be developed, not allowing the printing plate to be highly sensitized. However, in the former case, the degree of dissolvability can be adjusted by mixing a proper amount of a compound having no or little capability to dissolve the heat sensitive layer.

The pre-treatment liquid used in this invention is a pre-treatment liquid containing (a) a glycol compound and/or (b) a glycol ether compound respectively represented by the following general formula (I), or a pre-treatment liquid containing 0.1 to 30 wt % of (c) an amine compound. The compounds (a) to (c) are relatively clearly different in the performance as a pre-treatment liquid, and the different compounds can also be mixed for adaptation to respective purposes.

The glycol compound (a) or the glycol ether compound (b) respectively represented by the following general formula (I) shows excellent dissolvability only at the irradiated area of the heat sensitive layer of this invention (hereinafter, this dissolvability is called selective dissolvability).

$$R^2O(-CHR^1-CH_2-O)_nR^3 \quad (I)$$

(where $R^1$ denotes a hydrogen atom or alkyl group with 1 to 5 carbon atoms; $R^2$ and $R^3$ denote, respectively independently, a hydrogen atom or alkyl group with 1 to 15 carbon atoms; and n denotes an integer of 1 to 12.)

Generally, glycol ether compounds are higher in the capability to dissolve the heat sensitive layer than glycol compounds. Among the glycol ether compounds, those having small functional groups such as methyl groups as the end $R^2$ and $R^3$ groups are highly capable of dissolving the heat sensitive layer, and on the contrary, those having large functional groups such as 2-ethylhexyl groups tend to be lower in the capability to dissolve the heat sensitive layer than the glycol compounds.

By using any one or both as a mixture of compounds (a) and (b), pre-treatment liquids having optimum selective dissolvability for printing plates different in the curability of the heat sensitive layer can be obtained. As for the function of the pre-treatment liquid, not only the capability to selectively dissolve the heat sensitive layer but also the capability to swell the silicone rubber layer is important. If the silicone rubber layer is swollen, it is easy to remove the silicone rubber. So, even if the pre-treatment liquid used is low in the capability to dissolve the heat sensitive layer, it is easy to effect development. However, if the silicone rubber is swollen too much, scratches are likely to be caused at the time of development. So, it is preferable to keep the swelling in a proper range. Particularly, it is preferable that the silicone rubber swelling rate is 30% or less. The silicone rubber layer swelling rate by a glycol compound is almost 0%, and the silicone rubber layer is little swollen. So, simply the capability to selectively dissolve the heat sensitive layer is the function of the pre-treatment liquid. On the other hand, a glycol ether compound small in the frequency of the repeating unit and having straight chain functional groups long to some extent as $R^2$ and $R^3$ groups is high in the capability to swell the silicone rubber layer. In the comparison between glycol monoethers and glycol diethers, glycol diethers are generally higher in the capability to swell the silicone rubber. In such a case, the pre-treatment liquid is designed considering both the capability to selectively dissolve the heat sensitive layer and the capability to swell the silicone rubber.

Since an amine compound (c) is very high in the capability to dissolve the heat sensitive layer, it can be suitably used as an ingredient of the pre-treatment liquid for high sensitization. It dissolves the heat sensitive layer at the non-irradiated area to some extent, but is very high in the capability to dissolve the heat sensitive layer at the irradiated area, sensitively detecting the difference between the non-irradiated area and the irradiated area. However, to inhibit the capability to dissolve the heat sensitive layer at the non-irradiated area, it is necessary to mix it with a liquid relatively low in the capability to dissolve the heat sensitive layer, when using it.

(a) Glycol Compounds

Glycol compounds include ethylene glycol, propylene glycol, butylene glycol (1,2-butanediol), 2,3-butanediol, polyethylene glycol of n=2~12, polypropylene glycol, etc. Any one or more as a mixture of these glycol compounds can be used. Among them, in view of selective dissolvability, diethylene glycol, triethylene glycol, tetraethylene glycol, dipropylene glycol, tripropylene glycol and tetrapropylene glycol can be preferably used for the pre-treatment liquid.

(b) Glycol Ether Compounds

Glycol ether compounds include monoalkyl ethers and dialkyl ethers of the above glycol compounds. The alkyl groups which can be used as $R^2$ and $R^3$ include methyl group, ethyl group, propyl group, iso-propyl group, butyl group, iso-butyl group, tert-butyl group, pentyl group, hexyl group, heptyl group, octyl group, 2-ethylhexyl group, nonyl group, decanyl group, undecanyl group and dodecanyl group. Preferable glycol ether compounds include diethylene glycol monomethyl ether (methyl carbitol), diethylene glycol monoethyl ether (ethyl carbitol), diethylene glycol monopropyl ether (propyl carbitol), diethylene glycol monobutyl ether (butyl carbitol), diethylene glycol monohexyl ether, diethylene glycol mono-2-ethylhexyl ether, diethylene glycol dimethyl ether (diglyme), diethylene glycol methyl ethyl ether, diethylene glycol diethyl ether, triethylene glycol monomethyl ether, triethylene glycol monoethyl ether, triethylene glycol monopropyl ether, triethylene glycol monobutyl ether, triethylene glycol monohexyl ether, triethylene glycol mono-2-ethylhexyl ether, triethylene glycol dimethyl ether (triglyme), triethylene glycol methyl ethyl ether, triethylene glycol diethyl ether, tetraethylene glycol monomethyl ether, tetraethylene glycol monoethyl ether, tetraethylene glycol monopropyl ether, tetraethylene glycol monobutyl ether, tetraethylene glycol monohexyl ether, tetraethylene glycol 2-ethylhexyl ether, tetraethylene glycol dimethyl ether (tetraglyme), tetraethylene glycol methyl ethyl ether, tetraethylene glycol diethyl ether, dipropylene glycol monomethyl ether, dipropylene glycol monoethyl ether, dipropylene glycol monopropyl ether, dipropylene glycol monobutyl ether, dipropylene glycol monohexyl ether, dipropylene glycol mono-2-ethylhexyl ether, tripropylene glycol monomethyl ether, tripropylene glycol monoethyl ether, tripropylene glycol monopropyl ether, tripropylene glycol monobutyl ether, tripropylene glycol monohexyl ether, tripropylene glycol mono-2-ethylhexyl ether, tetrapropylene glycol monomethyl ether, tetrapropylene glycol monoethyl ether, tetrapropylene glycol monopropyl ether, tetrapropylene glycol monobutyl ether, tetrapropylene glycol monohexyl ether and tetrapropylene glycol mono-2-ethylhexyl ether.

The amine compounds (c) include the following. An amine compound solid at room temperature is used after it is dissolved into a solvent. (c-1) Aminoalcohols Ethylene glycol amine (ethanolamine, aminoethanol), diethylene glycol amine (diglycol amine), triethylene glycol amine, tetraethylene glycol amine, propylene glycol amine, dipropylene glycol amine, tripropylene glycol amine, N,N-dimethylaminoethanol, N,N-diethylaminoethanol, N,N-dibutylaminoethanol, N-(β-aminoethyl)aminoether, N-methylaminoethanol, diethanolamine, N-methyldiethanolamine, N-ethyldiethanolamine, N-butyldiethanolamine, 3-aminopropanol, 3-(N,N-dimethylamino)propanol, 2-aminopropanol, 2-amino-2-methyl-1,3-propanediol, 2-amino-1,3-propanediol, 2-amino-2-hydroxymethyl-1,3-propanediol.

(c-2) Morpholines

Morpholine, N-methylmorpholine, N-ethylmorpholine, cetylmorpholine, N-(2-aminoethyl)morpholine, N-(3-aminopropyl)morpholine.

(C-3) Piperidines

Piperidine, 2-, 3-, or 4-pipecoline, 2,4-, 2,6-, or 3,5-lupetidine, N-(2-aminoethyl)piperidine, N-(3-aminopropyl) piperidine, N-(2-aminoethyl)-4-pipecoline, N-(3-aminopropyl)-2-pipecoline, N-(3-aminopropyl)-4-pipecoline, 3-piperidinemethanol, N-methyl-3-piperidinemethanol, 2-piperidineethanol, pipecolic acid.

(c-4) Piperazines

Piperazine, 1-amino-4-methylpiperazine, N-hydroxyethoxyethylpiperazine (diethylene glycol piperazine), 1,4-bis(3-aminopropyl)piperazine, homopiperazine, N-(3-aminopropyl)piperazine, N-carboxyethylpiperazine, piperazine compounds such as DABCO (produced by Nippon Nyukazai Co., Ltd.).

(c-5) Others

Ethylenediamine, trimethylenediamine, tetramethylenediamine, polyethyleneamine, dimethylaminoethylamine, dimethylaminopropylamine, diethylaminopropylamine, 1,2-bis(3-aminopropoxy)ethane, methylamine, ethylamine, dimethylamine, diethylamine, trimethylamine, triethylamine, propylamine, butylamine, amylamine, dipropylamine, dibutylamine, diamylamine, tripropylamine, tributylamine, methyldiethylamine, 2-ethylhexylamine, di(2-ethylhexyl)amine, tri(2-ethylhexyl) amine, 3-ethoxypropylamine, 3-isopropoxypropylamine, 3-(2-ethylhexyloxy)propylamine, benzylamine, N,N-dimethylbenzylamine, N,N-diethylbenzylamine, N,N-dipropylbenzylamine, o-, or m-, p-methoxy, or methylbenzylamine, N,N-di(methoxybenzyl)amine, β-phenylethylamine, Y-phenylpropylamine, cyclohexylamine, aniline, monomethylaniline, dimethylaniline, toluidine, α- or β- naphthylamine, o-, or m-, or p-phenylenediamine, aminobenzoic acid, etc.

Among these amine compounds, aminoalcohols (c-1) and morpholines (c-2) can be more preferably used for the pre-treatment liquid. Above all, diethylene glycol amine, N-(β-aminoethyl) aminoethanol, diethanolamine, N-methyldiethanolamine, morpholine, N-methylmorpholine, N-(3-aminopropyl)morpholine can be further more preferably used for the pre-treatment liquid. Furthermore, diethylene glcyol amine and N-(β-aminoethyl) aminoethanol can be most preferably used for the pre-treatment liquid.

If the pre-treatment liquid contains any of the glycol compounds (a) or any of the glycol ether compounds (b), one or more as a mixture of compounds can be used. It is preferable that the compound content in the pre-treatment liquid is 50 wt % or more. More preferable is 70 wt % or more. If the content is smaller than 50 wt %, development in a high sensitivity region is difficult.

If the pre-treatment liquid contains any of the amine compounds (c), it is preferable that the amine compound content in the pre-treatment liquid is 0.1 to 30 wt %. A more preferable range is 0.5 to 20 wt %. If the content is smaller than 0.1 wt %, the sensitizing effect is low. If larger than 30 wt %, the capability to dissolve the heat sensitive layer is too high, and the silicone rubber layer is likely to be removed at not only the image area but also the non-image area.

The pre-treatment liquid can contain, as required, water, alcohol, carboxylic acid, ester, aliphatic hydrocarbon (hexane, heptane, etc.), aromatic hydrocarbon (toluene, xylene, etc.), or halogenated hydrocarbon (trichlene, etc.). Furthermore, to prevent that the plate surface is flawed when rubbed at the time of development, the pre-treatment liquid may also contain a surfactant such as a sulfate, phosphate, carboxylate or sulfonate.

Particular pre-treatment liquids which can be preferably used include a pre-treatment liquid consisting of diethylene glycol, diglycolamine and water, a pre-treatment liquid consisting of polypropylene glycol and polypropylene glycol monobutyl ether, a pre-treatment liquid consisting of diethylene glycol mono-2-ethylhexyl ether and 1,3-butanediol, a pre-treatment liquid consisting of polypropylene glycol, tetraethylene glycol mono-2-ethylhexyl ether and 2-ethylhexanoic acid, a pre-treatment liquid consisting of polyethylene glycol, triethylene glycol monoethyl ether (or tetraethylene glycol monomethyl ether) and water, and a pre-treatment liquid consisting of 100 parts by weight of any of the foregoing pre-treatment liquids and 0.1 to 3 parts by weight of any of said surfactants.

Any of the above pre-treatment liquids is used to dissolve or swell the surface zone of the heat sensitive layer at the laser irradiated area, and it is preferable to keep the temperature of the pre-treatment liquid constant for stably dissolving or swelling. The proper pre-treatment liquid temperature depends on the pre-treatment time. A preferable temperature range is 30° C. to 60° C., and the most preferable range is 35° C. to 50° C. If the pre-treatment liquid temperature is lower than 30° C., the heat sensitive layer is insufficiently dissolved or swollen, and the bonding strength between the silicone rubber layer and the heat sensitive layer may not be able to be lowered sufficiently. It is also difficult to keep the temperature lower than 30° C. in summer when air temperature is high. If the pre-treatment liquid temperature is higher than 60° C., the effect of the pre-treatment liquid becomes too high, and such problems that the heat sensitive layer peels from the substrate may be caused.

Depending on the immersion time in the pre-treatment liquid, the degree of dissolving the heat sensitive layer and the degree of swelling the silicone rubber layer changes. So, if the immersion time is kept constant, stable development can be effected. It is preferable that the immersion time in the pre-treatment liquid is 10 to 100 seconds. A more preferable range is 15 to 60 seconds. If the immersion time is shorter than 10 seconds, the control of immersion time is difficult, and it is difficult to effect stable development. An immersion time of longer than 100 seconds is unpreferable in view of working efficiency. Especially when an automatic processor for continuously effecting the pre-treatment step, the development step, and the after-treatment step is used, a longer immersion time in the pre-treatment step automatically elongates the times taken for the development step and the after-treatment step.

<Development Step (Third Step)>

Since the surface of the heat sensitive layer at the laser beam irradiated area is swollen or partially dissolved by the pre-treatment, the silicone rubber layer is in a condition to allow easy selective removal. In this invention, the plate surface is rubbed by a brush or cotton pad in the presence of water, to remove the ink repellent layer at the laser beam irradiated area, for development. The development by water is most preferable in view of waste water. Development can also be effected by spraying hot water or water vapor to the plate surface. For higher developability, a developer obtained by adding a small amount of the above pre-treatment liquid to water can also be used. The temperature of the developer can be arbitrary, but a range of 10° C. to 50° C. is preferable.

<Other Steps>

Subsequently as required, an after-treatment step for dyeing the heat sensitive layer at the image area by an after-treatment liquid and a rinsing step for perfectly washing away the pre-treatment liquid and the after-treatment liquid can also be additionally effected.

<After-Treatment Step>

For easier confirmation of the image area formed by development, an after-treatment step for dyeing by an after-treatment liquid can also be effected. The dye which can be used in the after-treatment liquid of this invention can be any one or more as a mixture selected from basic dyes, acid dyes, direct dyes, disperse dyes, reactive dyes, etc. Among them, water soluble basic dyes and acid dyes can be preferably used.

The basic dyes which can be used here include "Crystal Violet", "Ethyl Violet", "Victoria Pure Blue", "Victoria Blue", "Methyl Violet", "Diabasic Magenta" (produced by Mitsubishi Chemical Corporation), "Aizen Basic Cyanine 6GH" (produced by Hodogaya Chemical Co., Ltd.), "Primocyanine BX Conc" (produced by Sumitomo Chemical Co., Ltd.), "Astrazon Blue G" (produced by Farbenfabriken Bayer), "Diacryl Supra Brilliant 2B" (produced by Mitsubishi Chemical Corporation), "Aizen Cathilon Turquoise Blue LH" (produced by Hodogaya Chemical Co., Ltd.), "Aizen Malachite Green" (Produced by Hodogaya Chemical Co., Ltd.), etc.

The acid dyes which can be used here include "Acid Violet 5B" (produced by Hodogaya Chemical Co., Ltd.), "Kiton Blue A" (produced by Ciba), "Patent Blue AF (produced by BASF), "Rakuto Brilliant Blue FCF" (produced by Rakuto Kagakukogyo), "Brilliant Acid Blue R" (produced by Geigy), "Kayanol Cyanine 6B" (produced by Nippon Kayaku Co., Ltd.), "Supranol Cyanine G" (produced by Farbenfabriken Bayer), "Orient Soluble Blue OBB" (produced by Orient Chemical Industries Ltd.), "Acid Brilliant Blue 5G" (produced by Chugai Kasei K.K.), "Acid Brilliant Blue FFR" (produced by Chugai Kasei K.K.), "Acid Green GBH" (produced by Takaoka Kagaku Kogyo K.K.), "Acid Brilliant Milling Green B" (produced by Hodogaya Chemical Co., Ltd.), etc.

It is preferable that the dye content in the after-treatment liquid is 0.01 wt % to 10 wt %. A more preferable range is 0.1 wt % to 5 wt %.

The solvent of the after-treatment liquid used in this invention is any one or more as a mixture of water, alcohols, glycols, glycol monoalkyl ethers and glycol dialkyl ethers. Since any of glycols, glycol monoalkyl ethers and glycol dialkyl ethers also has an effect as a pre-treatment liquid, any silicone rubber layer at the laser beam irradiated area which happens to remain deposited without being developed in the development step can be developed in the after-treatment step.

Furthermore, a dyeing auxiliary, organic acid, inorganic acid, defoaming agent, plasticizer and surfactant can also be arbitrarily added.

The temperature of the after-treatment liquid can be arbitrary, but a range of 10° C. to 50° C. is preferable. Furthermore, any of said dyes can be added to the developer, for dyeing the image area simultaneously with development.

<Rinsing Step>

If the pre-treatment liquid and the after-treatment liquid remain to impregnate in the plate surface, the silicone rubber layer at the non-image area may become likely to peel with the lapse of time. So, a rinsing step for perfectly washing away the pre-treatment liquid and the after-treatment liquid from the plate surface can also be effected. The temperature of the washing water is arbitrary, but a range of 10° C. to 50° C. is preferable.

<Development Method>

The pre-treatment step, the development step, and as required, the after-treatment step and the rinsing step described above can be effected manually, but it is preferable to use "TWL-1160", "TWL-650" or "TWL-860" produced by Toray Industries, Inc. or an automatic processor for waterless printing plates as disclosed in Japanese Patent No. 2864907.

The brush generally used in the development step are obtained as follows. The brush is obtained by winding spirally around a pole core with a metallic or plastic channel bar in which the brush material wire of 20 to 500 μm in diameter is fastened in rows. The brush is also obtainedby fastening directly radially the above-mentioned wire into a pole core, or winding around a pole core with a substrate such as a plastic sheet or clothe in which the above-mentioned wire is fastened.

If the material of the brush wires is at least one selected from a group consisting of polyvinyl chloride, polyamides, polyethylene terephthalate, polybutylene terephthalate and polypropylene, the ink repellent layer of the printing plate is not flawed by the brush, and the insufficient removal of the ink repellent layer at the laser beam irradiated area due to insufficient brushing force can be prevented.

The speed of the brush roller is 10 to 1000 rpm. A preferable range is 200 to 600 rpm. If the brush roller is rotated and reciprocated in the axial direction, the effect of removing the ink repellent layer at the laser beam irradiated area can be improved. It is important in view of removing the ink repellent layer at the laser beam irradiated area, that the brush roller can be rotated in the same direction as the traveling direction of the printing plate and also in the direction reverse to it.

If development is effected manually, non-woven fabrics, absorbent cotton, cloth or sponges, etc. respectively impregnated with the pre-treatment liquid and the developer are used one after another for wiping the plate surface.

<Heat Sensitive Layer Remaining Rate>

To keep the image ditch cells shallow, it is necessary that the heat sensitive layer at the image area, i.e., laser beam irradiated area remains in the waterless planographic printing plate obtained through the development step. In this invention, this is achieved by adopting a special composition for the heat sensitive layer and a special method of producing the printing plate.

The remaining degree of the heat sensitive layer is expressed by a parameter called the heat sensitive layer remaining rate. The heat sensitive layer remaining rate can be measured by a tracer method using a probe, depth measurement by a laser microscope, SEM observation, or gravimetric method, etc. Among them, a gravimetric method can be preferably used since it can be easily effected without using any expensive apparatus and is high in measurement accuracy.

The gravimetric method is effected as described below.

Heat sensitive layer remaining rate (%)=$W_{1a}/W_{or}\times100$ $W_{1a}$: Weight per unit area of the heat sensitive layer after laser beam irradiation and development (g/$m^2$)

$W_{or}$: Weight per unit area of the original heat sensitive layer before laser beam irradiation (g/$m^2$)

<Gravimetric Method for Measuring the Heat Sensitive Layer Remaining Rate>

Two samples with a predetermined size Z ($m^2$) are prepared as A and B. Sample A is used for measuring the weight $W_{1a}$ of the heat sensitive layer at the image area after laser beam irradiation and development, and sample B is used for measuring the weight $W_{or}$ of the original heat sensitive layer before laser beam irradiation.

At first, sample A is irradiated with a laser beam on the entire plate at a predetermined energy. The irradiation energy must be at a level which allows the silicone rubber layer to be sufficiently removed or removed by development. The weight $Y_1$ (g) of the sample irradiated with a laser beam and developed is measured. Then, the heat sensitive layer only is perfectly removed by solvent 1, and the weight $Y_2$ (g) of the sample is measured. $W_{1a}$ can be obtained from the following formula:

$$W_{1a}=(Y_1-Y_2)/Z$$

From sample B, the silicone rubber layer only is perfectly removed by solvent 2, and the weight $Y_3$ (g) is measured. Then, furthermore the heat sensitive layer only is perfectly removed by solvent 1, and the weight $Y_4$ (g) is measured. $W_{or}$ is obtained from the following formula:

$$W_{or}=(Y_3-Y_4)/Z$$

As the solvent 1, a solvent which dissolves the heat sensitive layer but does not dissolve, if exists, the underlying layer is selected, and as the solvent 2, a solvent which dissolves the silicone rubber layer but does not dissolve the heat sensitive layer is selected.

The above is a method for measuring the heat sensitive layer remaining rate of the plate in which the laser beam irradiated area is the image area. For the plate in which the laser beam non-irradiated area is the image area, the remaining rate can be measured similarly by using sample A for measuring the weight ($W_{or}$) per unit area of the heat sensitive layer at the non-image area after laser beam irradiation, and using sample B for measuring the weight ($W_{1a}$) per unit area of the heat sensitive layer at the image layer before laser beam irradiation.

It is preferable that the heat sensitive layer remaining rate measured like this is 50 to 100 wt %. A more preferable range is 60 to 100 wt %. If the heat sensitive layer remaining rate is lower than 50 wt %, the image ditch cells become so deep as to be the ink mileage unpreferably.

It is meaningless to make the heat sensitive layer thicker for improving the heat sensitive layer remaining rate. Since what is important is the depth of image ditch cells, the decreased thickness of the heat sensitive layer is important. It is preferable that the decreased thickness of the heat sensitive layer is 0.50 g/m$^2$ or less. More preferable is 0.40 g/m$^2$.

This invention is described below in detail in reference to examples, but is not limited thereto or thereby.

<Production of Directly Imageable Waterless Planographic Printing Plate Precursors>

<Directly Imageable Waterless Planographic Printing Plate Precursor 1>

A degreased 0.24 mm thick aluminum sheet was coated with the following composition of heat sensitive layer 1 by a slit die coater, and dried at 130° C. for 60 seconds, to form a 1.0 g/m$^2$ thick heat sensitive layer.

Composition of Heat Sensitive Layer 1

(1) 11 parts by weight of "Kayasorb" IR-820B (polymethine based coloring element produced by Nippon Kayaku Co., Ltd.), (2) 9 parts by weight of "Nacem Titan" (n-butanol solution of titanium d-in-butoxide bis(2,4-pentanedionate) produced by Nippon Kagaku Sangyo Co., Ltd.) (calculated at a solid content of 40 wt %; 9 parts by weight as solid content), (3) 60 parts by weight of "Sumilite Resin" PR50622 (phenol novolak resin produced by Sumitomo Durez Co., Ltd.), (4) 10 parts by weight of "Sanprene" LQ-T1331D (polyurethane produced by Sanyo Chemical Industries Ltd.) (10 parts by weight as solid content) and (5) 10 parts by weight of an addition product of m-xylylenediamine/glycidyl methacrylate/3-glycidoxypropyltrimethoxysilane=1/3/1 as molar ratio, respectively as solid contents, were diluted by a mixed solvent consisting of (1) 89 parts by weight of tetrahydrofuran and (2) 11 parts by weight of dimethylformamide, to produce a composition with a solid content of 10.0 wt %.

Then, the heat sensitive layer was coated with the following composition of silicone rubber layer 1 by a slit die coater and dried at 125° C. for 60 seconds, to form a 2.0 g/m$^2$ thick silicone rubber layer.

Composition of Silicone Rubber Layer 1

(1) 100 parts by weight of α,ω-divinylpolydimethylsiloxane (molecular weight about 60,000), (2) 7 parts by weight of HMS-501 ((methylhydrogensiloxane) (dimethylsiloxane) copolymer with methyl groups at both the ends), number of SiH groups/molecular weight=0.69 mol/g, produced by Chisso Corporation), (3) 3 parts by weight of vinyltris (methylethylketoximino) silane and (4) 5 parts by weight of "SRX-212" (platinum catalyst produced by Toray Dow Corning Silicone Co., Ltd.), respectively as solid contents, were diluted by a solvent, "Isopar E" (isoparaffin hydrocarbon produced by Exxon Chemical Japan), into a composition with a solid content of 10.3 wt %.

On the laminate obtained as described above, an 8 μm thick polypropylene film, "Torayfan" BO (produced by Toray Industries, Inc.) was laminated using a calender roller, to obtain a directly imageable planographic printing plate precursor 1.

<Directly Imageable Waterless Planographic Printing Plate Precursor 2>

A degreased 0.24 mm thick aluminum sheet was coated with the following composition of heat insulating layer 1 and dried at 200° C. for 2 minutes, to form a 3 g/m$^2$ thick heat insulating layer.

Composition of Heat Insulating Layer 1

"Kan-coat" 90T-25-3094 (epoxy-phenol resin produced by Kansai Paint Co., Ltd.) as a solid was diluted by dimethylformamide solvent into a composition with a solid content of 15.0 wt %.

The heat insulating layer was coated with the following composition of heat sensitive layer 2 using a bar coater and dried at 150° C. for 1 minute, to form a 1 g/m$^2$ thick heat sensitive layer.

Composition of Heat Sensitive Layer 2

(1) 7 parts by weight of #30 (carbon black produced by Mitsubishi Chemical Corporation), (2) 15 parts by weight of "Bergerac NC" (nitrocellulose, nitrogen content 11.0%, produced by SNPE Japan K.K. ), (3) 18 parts by weight of "Sumilac" PC-1 (resol resin produced by Sumitomo Durez Co., Ltd.), (4) 15 parts by weight of "Denacol" EX-421 (epoxy resin produced by Nagase Chemicals, Ltd.), (5) 9 parts by weight of "Tesazine" 3073-60 (butylated benzoguanamine resin produced by Hitachi Kasei Polymer Co., Ltd.), (6) 5 parts by weight of an addition product of m-xylylenediamine/glycidyl methacrylate/3-glycidoxypropyltrimethoxysilane=1/3/1 molar ratio and (7) 0.5 part by weight of "Fluorad" FC430 (fluorine based surfactant produced by Sumitomo 3M Limited), respectively as solid contents, were diluted by a mixed solvent consisting of (1) 11 parts by weight of tetrahydrofuran, (2) 11 parts by weight of dimethylformamide and (3) 78 parts by weight of methyl ethyl ketone, into a composition with a solid content of 7.17 wt %.

Then, the heat sensitive layer was coated with the following composition of silicone rubber layer 2 using a bar coater and dried at 120° C. for 1 minute, to form a 2.0 g/m$^2$ thick silicone rubber layer.

Composition of Silicone Rubber Layer 2

(1) 100 parts by weight of α,ω-divinylpolydimethylsiloxane (polymerization degree 770), (2) 4 parts by weight of HMS-501 ((methylhydrogensiloxane) (dimethylsiloxane) copolymer with methyl groups at both the ends, number of SiH groups/molecular weight=0.69 mol/g, produced by Chisso Corporation), (3) 0.02 part by weight of olefin coordinated platinum and (4) 0.3 part by weight of "BY24-808" (reaction inhibitor produced by Toray Dow Corning Silicone Co., Ltd.), respectively as solid contents, were diluted by a solvent, "Isopar E" (produced by Exxon Chemical Japan), into a composition with a solid content of 9.44 wt %.

Onto the laminate obtained as described above, an 8 μm thick polypropylene film, "Torayfan" BO (produced by Toray Industries, Inc.) was laminated using a calender roller, to obtain a directly imageable planographic printing plate precursor 2.

<Directly Imageable Waterless Planographic Printing Plate Precursor 3>

A degreased 0.15 mm thick aluminum sheet was coated with the following composition of heat insulating layer 2 using a bar coater and dried at 200° C. for 2 minutes, to form a 3 g/m$^2$ thick heat insulating layer.

Composition of Heat Insulating Layer 2

(1) 90 parts by weight of "Kan-coat" 90T-25-3094 (epoxy-phenol resin produced by Kansai Paint Co., Ltd.) and (2) 10 parts by weight of "Shonol" BKS-327 (resol resin produced by Showa Hypolymer Co. Ltd.), respectively as solid contents, were diluted by dimethylformamide solvent into a composition with a solid content of 14.0 wt %.

In succession, the heat insulating layer was coated with the following composition of heat sensitive layer 3 using a bar coater and dried at 120° C. for 30 seconds, to form a 1.0 g/m$^2$ thick heat sensitive layer. ps Composition of Heat Sensitive Layer 3

(1) 10 parts by weight of "Kayasorb" IR-820B (polymethine based coloring element produced by Nippon Kayaku Co., Ltd.), (2) 15 parts by weight of "Nacem Titan" (n-butanol solution of titanium di-n-butoxide bis(2,4-pentanedionate) produced by Nippon Kagaku Sangyo Co., Ltd.), (3) 50 parts by weight of "Sumilite Resin" PR50622 (phenol novolak resin produced by Sumitomo Durez Co., Ltd.), (4) 22 parts by weight of "Sanprene" IB-114B (hydroxyl group-containing polyurethane resin produced by Sanyo Chemical Industries Ltd.) and (5) 3 parts by weight of γ-aminopropyltriethoxysilane, respectively as solid contents, were diluted by a mixed solvent consisting of (1) 85 parts by weight of tetrahydrofuran and (2) 15 parts by weight of dimethylformamide into a composition with a solid content of 14.0 wt %.

In succession, the heat sensitive layer was coated with the following composition of silicone rubber layer 3 using a bar coater and dried at 125° C. for 1 minute, to form a 2 g/m$^2$ thick silicone rubber layer.

Composition of Silicone Rubber Layer 3

(1) 100 parts by weight of α,ω-divinylpolydimethylsiloxane (molecular weight about 60,000), (2) 7 parts by weight of HMS-501 ((methylhydrogensiloxane) (dimethylsiloxane) copolymer with methyl groups at both the ends, number of SiH groups/molecular weight=0.69 mol/g, produced by Chisso Corporation, (3) 3 parts by weight of "BY24-808" (reaction inhibitor produced by Toray Dow Corning Silicone Co., Ltd.), (4) 5 parts by weight of "SRX-212" (platinum catalyst produced by Toray Dow Corning Silicone Co., Ltd.) and (5) 3 parts by weight of vinyltris (methylethylketoximino) silane, respectively as solid contents, were diluted by a solvent, "Isopar E" (isoparaffin hydrocarbon produced by Exxon Chemical Japan) into a composition with a solid content of 10.0 wt %.

Onto the laminate obtained as above, an 8 μm thick polypropylene film, "Torayfan" BO (produced by Toray Industries, Inc.) was laminated using a calender roller, to obtain a directly imageable waterless planographic printing plate precursor 3.

<Directly Imageable Waterless Planographic Printing Plate Precursor 4>

A directly imageable waterless planographic printing plate precursor 4 was obtained as described for producing the directly imageable waterless planographic printing plate precursor 3, except that the following composition of heat sensitive layer 4 was used.

Composition of Heat Sensitive Layer 4

(1) 10 parts by weight of "Kayasorb" IR-820B (polymethine based coloring element produced by Nippon Kayaku Co., Ltd.), (2) 15 parts by weight of "Nacem Titan" (n-butanol solution of titanium di-n-butoxide bis(2,4-pentanedionate) produced by Nippon Kagaku Sangyo Co., Ltd.), (3) 45 parts of "Tespol" 1150 (rosin modified maleic acid resin produced by Hitachi Kasei Polymer Co., Ltd.), (4) 27 parts by weight of "Sanprene" LQ-T1331 (polyurethane resin produced by Sanyo Chemical Industries Ltd.) and (5) 3 parts by weight of γ-aminopropyltriethoxysilane, respectively as solid contents, were diluted by a mixed solvent consisting of (1) 10 parts by weight of dimethylformamide, (2) 50 parts by weight of ethyl cellosolve and (3) 40 parts by weight of methyl ethyl ketone into a composition with a solid content of 11.0 wt %.

<Directly Imageable Waterless Planographic Printing Plate Precursor 5>

A degreased 0.24 mm thick aluminum sheet was coated with the following composition of heat sensitive layer 6 using a bar coater and dried at 130° C. for 2 minutes, to form a 1 g/m$^2$ thick heat sensitive layer.

Composition of Heat Sensitive Layer 5

(1) 10 parts by weight of "Kayasorb" IR-820B (polymethine based coloring element produced by Nippon Kayaku Co., Ltd.), (2) 10 parts by weight of "Nacem Titan" (n-butanol solution of titanium di-n-butoxide bis(2,4-pentanedionate) produced by Nippon Kagaku Sangyo Co., Ltd.) and (3) 70 parts by weight of "Sumilite Resin" PR50622 (phenol novolak resin produced by Sumitomo Durez Co., Ltd.), respectively as solid contents, were diluted by a mixed solvent consisting of (1) 61 parts by weight of tetrahydrofuran and (2) 39 parts by weight of dimethylformamide into a composition with a solid content of 9.09 wt %.

Then, the heat sensitive layer was coated with the above composition of silicone rubber layer 3 using a bar coater and dried at 120° C. for 1 minute, to form a 2.0 g/m$^2$ thick silicone rubber layer.

Onto the laminate obtained as described above, an 8 μm thick polypropylene film, "Torayfan" BO (produced by Toray Industries, Inc.) was laminated using a calender roller, to obtain a directly imageable waterless planographic printing plate precursor 5.

The compositions of the pre-treatment liquids, the composition of the developer and the composition of the after-treatment liquid as a dyeing solution respectively used in the following examples and comparative examples are shown below.

Composition of <Pre-treatment Liquid 1>

(1) Triethylene glycol: 92 parts by weight (2) LB-285 (polypropylene glycol monobutyl ether, molecular weight about 1200, produced by Sanyo Chemical Industries Ltd.):

8 Parts by Weight

Composition of <Pre-treatment Liquid 2>

(1) Triethylene glycol: 85 parts by weight (2) Diethylene glycol 2-ethylhexyl ether: 14 parts by weight (3) SO-35 (sodium 2-ethylhexylsulfate, 40% aqueous solution, anionic surfactant produced by New Japan Chemical Co., Ltd.): 1 part by weight Composition of <Pre-treatment Liquid 3>

(1) Triethylene glycol: 72 parts by weight (2) Diethylene glycol 2-ethylhexyl ether: 10 parts by weight (3) Diethylene glycol dimethyl ether: 10 parts by weight (4) Water: 8 parts by weight Composition of <Pre-treatment Liquid 4>

(1) Polypropylene glycol (molecular weight about 200): 85 parts by weight (2) LB-285 (polypropylene glycol monobutyl ether, molecular weight about 1200, produced by Sanyo Chemical Industries Ltd.): 15 parts by weight Composition of <Pre-treatment Liquid 5>

(1) Tetraethylene glycol: 45 parts by weight (2) Triethylene glycol monoethyl ether: 45 parts by weight (3) Water: 10 parts by weight Composition of <Pre-treatment Liquid 6>

(1) Diethylene glycol: 80 parts by weight (2) Diethylene glycol amine: 15 parts by weight (3) SO-35 (sodium 2-ethylhexylsulfate, 40% aqueous solution, anionic surfactant, produced by New Japan Chemical Co., Ltd.): 1 part by weight (4) Water: 4 parts by weight Composition of <Pre-treatment Liquid 7>

(1) Triethylene glycol: 92 parts by weight (2) LB-285 (polypropylene glycol monobutyl ether, molecular weight about 1200, produced by Sanyo Chemical Industries Ltd.); 7.1 parts by weight (3) Diethylene glycol amine: 0.9 part by weight Composition of <Pre-treatment Liquid 8>

(1) Triethylene glycol: 92.85 parts by weight (2) LB-285 (polypropylene glycol monobutyl ether, molecular weight about 1200, produced by Sanyo Chemical Industries Ltd.): 7.1 parts by weight (3) Diethylene glycol amine: 0.05 part by weight Composition of <Pre-treatment Liquid 9>

(1) Triethylene glycol: 42.9 parts by weight (2) LB-285 (polypropylene glycol monobutyl ether, molecular weight about 1200, produced by Sanyo Chemical Industries Ltd.):

7.1 parts by weight (3) Diethylene glycol amine: 50 parts by weight

Composition of <Pre-treatment Liquid 10>

(1) diglycolamine: 95 parts by weight (2) Water: 4 parts by weight (3) SO-35 (sodium 2-ethylhexylsulfate, 40% aqueous solution, anionic surfactant, produced by New Japan Chemical Co., Ltd.): 1 part by weight Composition of <Pre-treatment Liquid 11>

(1) Water: 90 parts by weight (2) N,N-dimethylaminoethanol: 10 parts by weight

Composition of <Pre-treatment Liquid 12>

(1) Diethylene glycol 2-ethylhexyl ether: 80 parts by weight (2) N-(β-aminoethyl)aminoethanol: 12 parts by weight (3) LB-285 (polypropylene glycol monobutyl ether, molecular weight about 1200, produced by Sanyo Chemical Industries Ltd.): 8 parts by weight Composition of <Pre-treatment Liquid 13>

(1) Polypropylene glycol (average molecular weight 400): 83 parts by weight (2) Morpholine: 5 parts by weight (3) N-methylmorpholine: 3 parts by weight (4) Water: 4 parts by weight (5) 1,3-butanediol: 5 parts by weight Composition of <Pre-treatment Liquid 14>

(1) Tetrahydrofuran: Alone

Composition of <Pre-treatment Liquid 15>

(1) "Isopar" E (produced by Exxon Chemical Japan): Alone

Composition of <Pre-treatment Liquid 16>

(1) Triethylene glycol: 50 parts by weight (2) Diethylene glycol dimethyl ether: 42 parts by weight (3) LB-285 (polypropylene glycol monobutyl ether, molecular weight about 1200, produced by Sanyo Chemical Industries Ltd.): 8 parts by weight Composition of <Pre-treatment Liquid 17>

(1) Diethylene glycol 2-ethylhexyl ether: 69 parts by weight (2) 1,3-butanediol: 31 parts by weight Composition of <Developer>

(1) Triethylene glycol: 3 parts by weight (2) Water: 97 parts by weight

Composition of <After-treatment Liquid>

(1) Crystal Violet (basic dye produced by Hodogaya Chemical Co., Ltd.): 0.10 part by weight (2) Brilliant Basic Cyanine 6GH (basic dye produced by Hodogaya Chemical Co., Ltd.): 0.40 part by weight (3) SO-35 (sodium 2-ethylhexylsulfate, 40% aqueous solution, anionic surfactant, produced by New Japan Chemical Co., Ltd.): 5.00 parts by weight (4) N-723 (polyethylene glycol phenyl ether, 6.60% aqueous solution, nonionic surfactant, produced by Nippon Nyukazai Co., Ltd.): 0.84 part by weight (5) Diethylene glycol monobutyl ether: 10 parts by weight (6) Dipropylene glycol: 5 parts by weight (7) KS-502 (defoaming agent produced by Shin-Etsu Chemical Co., Ltd.): 0.002 part by weight (8) Water: 78.658 parts by weight

EXAMPLE 1

The directly imageable waterless planographic printing plate precursor 1 was installed in "GX-3600" (platesetter produced by Toray Industries, Inc.) after removing the cover film, and irradiated with a semiconductor laser (wavelength 830 nm) (irradiation energy 175mJ/cm$^2$, resolution 2400 dpi (dots per inch), 175 lpi (lines per inch)).

Then, it was processed by an automatic processor for waterless planographic printing plates, "TWL-860KII" (produced by Toray Industries, Inc.), with <the pre-treatment liquid 6> kept in the first tank of the automatic processor and with water kept in the second and third tanks, to develop a directly imageable planographic printing plate.

In the first tank, the pre-treatment liquid was applied onto the printing plate surface, to dissolve or swell the surface zone of the heat sensitive layer. The pre-treatment liquid temperature was 40° C., and the immersion time was 30 seconds.

While the printing plate was automatically carried from the first tank to the second tank, the pre-treatment liquid on the printing plate surface was removed by a roll. In the second and third tanks, the printing plate had water applied on the surface while being rubbed by a brush rotating in the same direction as the traveling direction of the printing plate (second tank) and by a brush rotating in the reverse direction (third tank). As the liquid for brushing, water was used. Water temperature was 25° C.

As a result, a directly imageable planographic printing plate free from the silicone rubber layer at the portions irradiated with the laser beam could be obtained.

The obtained printing plate was observed by a 25-fold magnifying lens, to evaluate the image reproducibility. The reproducibility range was 1 to 99%. The reproducibility in this case is expressed by the range of the halftone dots of the image printed on a printing plate at the above resolution (2400 dpi, 175 lpi), which can be reproduced on a print. The wider the range, a print of better quality can be obtained. Each halftone dot expresses the percentage of the image area. A 1% or 2% dot (a highlight region) does not allow easy development or ink acceptance since the image area is very small, but on the contrary, a 98% or 99% dot (a shadow region) is likely to peel or to cause ink overflow since the non-image area is very small.

Furthermore, the printing plate was installed in a sheet-fed offset printing machine, "Sprint 25" (Komori Corp.), to print on wood-free paper (62.5 kg/636×939) using a waterless planographic ink, "Dry-O-Color" NSI" indigo (produced by Dainippon Ink & Chemicals, Incorporated), for evaluating the image reproducibility as prints. The reproducibility range was 1 to 99%.

<Measurement of Transmittance of Heat Sensitive Layer>

A 50 μm thick polyethylene terephthalate film, "Lumirror" T150 (produced by Toray Industries, Inc.) was coated with the above mentioned heat sensitive layer 1 with the same thickness in quite the same way, and dried. The transmittance of the heat sensitive layer at 830 μm was measured by "Spectrophotometer U-3210" (produced by Hitachi, Ltd.), and found to be 2.7%.

<Confirmation of Change in the Surface Zone of Heat Sensitive Layer by Laser Irradiation>

An aluminum substrate was coated with a heat sensitive layer only, and was not coated with a silicone rubber layer, though dried as if it had been coated with a silicone rubber layer, to prepare a model plate.

This model plate was immersed in the above pre-treatment liquid for 30 seconds and dried at 120° C. for 20 minutes. The weights of the plate before and after the immersion were measured, and it was found that the weight decreased by about 5%.

The model plate was irradiated with a laser beam on the entire surface as described above, and the weights of the plate before and after the laser beam irradiation were measured. Any change in the weight by laser beam irradiation was not found.

<Measurement of Heat Sensitive Layer Remaining Rate>

Furthermore, the laser beam irradiated model plate was immersed in the <pre-treatment liquid 6> for 30 seconds and dried at 120° C. for 20 minutes. The model plate was observed and found to have changed in the appearance of the surface zone of the heat sensitive layer. The weights of the plate before and after the immersion were measured, and it was found that the weight decreased by about 28% (that is, the heat sensitive layer remaining rate was 72%).

As a result, it was confirmed that the laser beam irradiation caused the surface zone of the heat sensitive layer to react and be dissolved in the pre-treatment liquid.

Comparative Example 1

A printing plate was produced as described for Example 1, except that the following liquids were used in the automatic processor.

First tank: Nil

Second tank: Water (25° C.)

Third tank: 2 parts by weight of "Emasol" 4105R (nonionic surfactant, polyoxyethylene sorbitan monooleate, produced by Kao Corporation) and 998 parts by weight of water (25° C.)

The image reproducibility was evaluated as described for Example 1, and the reproducibility range of the printing plate was only 4 to 96%. Furthermore, in the prints, the ink acceptance was poor, and the reproducibility range was 5 to 96%.

That is, when the second step of this invention was neglected, the surface zone of the heat sensitive layer at the laser beam irradiated area was not dissolved or swollen, causing the image reproducibility to be poor.

Comparative Example 2

A printing plate was produced as described for Example 1, except that the following liquids were used in the automatic processor.

First tank: Nil

Second tank: <Pre-treatment liquid 6>

Third tank: <Pre-treatment liquid 6>

The image reproducibility was evaluated as described for Example 1, and the reproducibility range of the printing plate was 1 to 98%. However, innumerable flaws due to brushing were observed on the silicone rubber layer. Also in the prints, the soil due to the flaws was observed. Moreover, the ink acceptance especially in the highlighted region was poor.

That is, it can be seen that if the second and third steps in this invention are not effected successively and the ink repellent layer at the laser beam irradiated area is removed by brushing in the presence of a pre-treatment liquid, then the image reproducibility is poor.

Comparative Example 3

The directly imageable waterless planographic printing plate precursor 2 was installed in "GX-3600" (platesetter produced by Toray Industries, Inc.) after removing the cover film, and irradiated with a semiconductor laser beam (wavelength 830 nm) (irradiation energy 600 mJ/cm$^2$, 2400 dpi, 175 lpi).

As a result, a printing plate, from which the entire heat sensitive layer was burned away at the laser beam irradiated area, was obtained. Furthermore, the processing by an automatic processor and the evaluation of image reproducibility were effected as described for Example 1. The printing plate was poor in the reproducibility of shadow region, the reproducibility range being 1 to 97%, and in the prints, the reproducibility of very small halftone dots was poor, the reproducibiity range being 3 to 97%.

The transmittance of the heat sensitive layer 2 used in Comparative Example 3 was 26.3%. That is, since the entire heat sensitive layer was burned away, the image reproducibility was poor.

TABLE 1

| | Printing plate used | Laser energy | Liquids used in the automatic processor | | | Results | | |
|---|---|---|---|---|---|---|---|---|
| | | | First tank | Second tank | Third tank | Image Reproducibility | Transmittance | Other |
| Example 1 | 1 | 175 mJ/cm$^2$ | <Pre-treatment liquid 6> | water | water | 1%~99% | 2.7% | Remaining rate 72% |
| Comparative Example 1 | | | Nil | water | Water containing a small amount of a surfactant | 5%~96% | | |
| Comparative Example 2 | | | Nil | <Pre-treatment liquid 6> | <Pre-treatment liquid 6> | 1%~98% | | Brushing flaws, poor ink Acceptance |
| Comparative Example 3 | 2 | 600 mJ/cm$^2$ | <Pre-treatment liquid 6> | water | water | 3%~97% | 26.3% | |

Setter: GX3600, 175 mJ/cm$^2$ or 600 mJ/cm$^2$, 2400 dpi

EXAMPLE 2

The directly imageable waterless planographic printing plate precursor 3 was installed in FX400-AP (platesetter produced by Toray Engineering Co.) after removing the cover film, and imagewisely irradiated with a semiconductor laser (wavelength 830 nm, beam diameter 20 $\mu$m). In this case, the energy of the laser was set at any of 400 mJ/cm$^2$ (0 marks), 300 mJ/cm$^2$ (1 marks), 250 mJ/cm$^2$ (2 marks), 210 mJ/cm$^2$ (3 marks), 180 mJ/cm$^2$ (4 marks), 150 mJ/cm$^2$ (5 marks), 130 mJ/cm$^2$ (6 marks) and 110 mJ/cm$^2$ (7 marks) respectively, for irradiation.

In succession, the imagewisely irradiated plate was developed using TWL-860KII (automatic processor for waterless planographic printing plates produced by Toray Industries, Inc.). In this case, the <pre-treatment liquid 1> was used in the first tank of the automatic processor; water, in the second tank; and water, in the third tank. The pre-treatment liquid temperature was kept at 40° C., and the developer temperature, at 30° C. The processing speed was 120 cm/min (pre-treatment liquid immersion time was 30 seconds).

Then, a planographic ink (Waterless S. produced by The Ink Tech Co., Ltd., red) was spread on the entire surface of the developed plate by a hand roller, to examine the ink acceptance. The plate surface was observed by an optical microscope to evaluate the image reproducibility, and the portions where the ink was perfectly accepted were judged as the portions where the silicone rubber layer was removed. The marks of the portions which could be obtained at the lowest laser energy were identified as the sensitivity of the plate. This example showed a sensitivity as high as 4 marks. The result is shown in Table 2 (together with the results of all the examples and comparative examples). Furthermore, the obtained printing plate was installed in a sheet-fed offset printing machine, “Hamada RS34L” (produced by Hamada Printing Press Co., Ltd.), to print on wood-free paper (62.5 kg/636×939) using a waterless planographic ink (Dry-O-Color NSI, indigo, produced by Dainippoin Ink & Chemicals, Incorporated), and prints accurately reproducing the image in a range of 2 to 98% could be obtained.

The heat sensitive layer remaining rate at a laser energy of 180 mJ/cm$^2$ was measured and found to be 80%.

EXAMPLES 3 to 6

Image reproducibility ranges were evaluated as described for Example 2, except that any of <pre-treatment liquid 2> to <pre-treatment liquid 5> was used instead of <pre-treatment liquid 1> in the first tank of the automatic processor for developing the directly imageable waterless planographic printing plate precursor 3. As shown in Table 2, the sensitivities of the plates were as high as 4 to 6 marks. The respectively developed printing plates were used for printing as described for Example 2, and prints accurately reproducing the image in a range of 2 to 98% could be obtained. The heat sensitive layer remaining rates at a laser energy of 180 mJ/cm$^2$ are also shown in Table 2. All the examples showed heat sensitive layer remaining rates as high as more than 70%.

EXAMPLE 7

An image reproducibility range was evaluated as described for Example 2, except that the <developer> was used instead of water in the second tank of the automatic processor, and that the <after-treatment liquid> was used instead of water in the third tank, for developing the directly imageable waterless planographic printing plate precursor 3. As shown in Table 2, the sensitivity of the plate was as high as 5 marks. Since water containing a small amount (3%) of triethylene glycol which was the main ingredient of the pre-treatment liquid was used as the developer, the sensitivity increased (from 4 marks to 5 marks). Furthermore, as described for Example 2, the developed printing plate was used for printing, and prints accurately reproducing the image in a range of 2 to 98% could be obtained. Moreover, the heat sensitive layer remaining rate at a laser energy of 180 mJ/cm$^2$ was measured as described for Example 1 and found to be 72%.

Comparative Example 4

An image reproducibility range was evaluated as described for Example 2, except that water was used instead of the <pre-treatment liquid 1> in the first tank of the automatic processor, for developing the directly imageable waterless planographic printing plate precursor 3. The sensitivity of the plate was as low as 1 marks, and since a high energy (more than 300 mJ/cm$^2$) was necessary for reproducing the image, the plate processing efficiency was low. Furthermore, as described for Example 2, the developed printing plate was used for printing, and only the solid region and the image in a range of 10% to 90% only could be reproduced, not allowing good quality prints to be obtained.

EXAMPLES 8 and 9

Image reproducibility ranges were evaluated as described for Example 2, except that the <pre-treatment liquid 6> or <pre-treatment liquid 7> respectively containing an amine compound was used instead of the <pre-treatment liquid 1> in the first tank of the automatic processor, for developing the directly imageable waterless planographic printing plate precursor 3. As shown in Table 2, the sensitivities of the plates were as high as 6 marks. Compared to Examples 2 to 7 where the pre-treatment liquid did not contain any amine compound, the sensitivities were generally higher. As described for Example 2, the developed printing plates were used for printing, and prints accurately reproducing the image in a range of 2 to 98% could be obtained respectively. Moreover, the heat sensitive layer remaining rates at 130 mJ/cm$^2$ were measured as described for Example 1, and found to as high as 80% or more as shown in Table 2.

EXAMPLE 10

An image reproducibility range was evaluated as described for Example 2, except that the <pre-treatment liquid 8> was used instead of the <pre-treatment liquid 1> in the first tank of the automatic processor, for developing the directly imageable waterless planographic printing plate precursor 3. The sensitivity of the plate was as high as 4 marks. However, since the amine compound content was 0.05 wt %, any large improving effect could be observed unlike Example 9 where the <pre-treatment liquid 7> containing 0.9 wt % of an amine compound was used. The effect was as achieved in Example 2 where no amine compound was used. The heat sensitive layer remaining rate at 180 mJ/cm$^2$ measured as described for Example 1 was 75%.

Comparative Examples 5 and 6

Image reproducibility ranges were evaluated as described for Example 2, except that the <pre-treatment liquid 9> or <pre-treatment liquid 10> was used instead of the <pre-treatment liquid 1> in the first tank of the automatic processor, for developing the directly imageable waterless planographic printing plate precursor 3. In Comparative Example 5 where the <pretreatment liquid 9> containing 50 wt % of an amine was used, the sensitivity of the plate was as high as 7 marks. However, when the developed plate was used for printing as described for Example 2, the image at the shadow region of 90% or more could not be reproduced. That is, if the amine content in the pre-treatment liquid is too large, even the silicone rubber layer at the non-image area of very small dots is developed, to show that a pre-treatment liquid containing more than 50 wt % of an amine like the <pre-treatment liquid 9> is not preferable. In Comparative Example 6 wherein the <pre-treatment liquid 10> with a high amine content was used, the silicone rubber layer was removed in the entire printing plate irrespective of the laser beam irradiated area or laser beam non-irradiated area, and no image could be reproduced. Furthermore, the heat sensitive layer at the laser beam irradiated area was perfectly removed to expose the underlying heat insulating layer.

EXAMPLES 11 to 13

Image reproducibility ranges were evaluated as described for Example 2, except that the <pre-treatment liquid 11>, <pre-treatment liquid 12> or <pre-treatment liquid 13> was used instead of the <pre-treatment liquid 1> in the first tank of the automatic processor, for developing the directly imageable waterless planographic printing plate precursor 3. As shown in Table 2, the sensitivities of all the plates were as high as 6 marks. As described for Example 2, the developed printing plates were used for printing, and prints accurately reproducing the image in a range of 2 to 98% could be obtained. Furthermore, the heat sensitive layer remaining rates at 130 mJ/cm$^2$ were measured as described for Example 1, and the results are also shown in Table 2.

EXAMPLE 14

An image reproducibility range was evaluated as described for Example 2, except that the <pre-treatment liquid 7> was used in the first tank of the automatic processor, that the <developer>n was used in the second tank, and that the <after-treatment liquid> was used instead of water in the third tank, for developing the directly imageable waterless planographic printing plate precursor 3. As shown in Table 2, the sensitivity of the plate was as high as 7 marks. Since water containing a small amount of triethylene glycol which was the main ingredient of the pre-treatment liquid was used as the developer, the sensitivity increased (from 6 marks to 7 marks), compared to Example 9 where the developer was water. Furthermore, as described for Example 2, the developed printing plate was used for printing, and prints accurately reproducing the image in a range of 2 to 98% could be obtained. The heat sensitive layer remaining rate at 130 mJ/cm$^2$ was measured as described for Example 1 and found to be 69%.

Comparative Examples 7 and 8

Image reproducibility ranges were evaluated as described for Example 2, except that the <pre-treatment liquid 14> or <pre-treatment liquid 15> was used instead of the <pre-treatment liquid 1> in the first tank of the automatic processor, for developing the directly imageable waterless planographic printing plate precursor 3.

In Comparative Example 7 where the <pre-treatment liquid 14> was used, the silicone rubber layer was removed on the entire plate surface irrespective of the laser beam irradiated area or the laser beam non-irradiated area, and no image could be reproduced. Furthermore, the heat sensitive layer was perfectly removed at the laser beam irradiated area, to expose the underlying heat insulating layer. In Comparative Example 8 where the <pre-treatment liquid 15> was used, the sensitivity of the plate was as high as 3 marks to some extent, but the silicone rubber layer at the non-image area had many scratches on the surface unpreferably for use as a printing plate.

EXAMPLE 15

An image reproducibility range was evaluated as described for Example 2, except that the <pre-treatment liquid 16> was used in the first tank of the automatic processor, that water used in the second tank, and that the <after-treatment liquid> was used in the third tank, for developing the directly imageable waterless planographic printing plate precursor 4. As shown in Table 2, the sensitivity of the plate was as high as 4 marks. As described for Example 2, the developed printing plate was used for printing, and prints accurately reproducing the image in a range of 2 to 98% could be obtained. The heat sensitive layer remaining rate at 180 mJ/cm$^2$ was measured as described for Example 1 and found to be 65%.

EXAMPLE 16

An image reproducibility range was evaluated as described for Example 2, except that the <pre-treatment liquid 16> was used in the first tank of the automatic processor, that the <developer> was used in the second tank, and that the <after-treatment liquid> was used in the third tank, for developing the directly imageable waterless planographic printing plate precursor 4. As shown in Table 2, the sensitivity of the plate was as high as 5 marks. Since water containing a small amount of triethylene glycol which was the main ingredient of the pre-treatment liquid was used as the developer, the sensitivity increased (from 4 marks to 5 marks), compared to Example 15 where the developer was water. Furthermore, as described for Example 2, the developed printing plate was used for printing, and prints accurately reproducing the image in a range of 2 to 98% could be obtained. Moreover, the heat sensitive layer remaining rate at 180 mJ/$cm^2$ was measured as described for Example 1 and found to be 59%.

EXAMPLES 17 to 19

Image reproducibility ranges were evaluated as described for Example 2, except that the <pre-treatment liquid 1> was used in the first tank, water in the second tank, and water in the third tank in Example 17, that the <pre-treatment liquid 7> in the first tank, water in the second tank, and water in the third tank in Example 18, or that the <pre-treatment liquid 7> was used in the first tank, the <developer> in the second tank, and water in the third tank in Example 19, respectively for developing the directly imageable waterless planographic printing plate precursor 4. In these examples, sensitivities as high as 6 marks could be obtained in Examples 18 and 19 containing an amine. Furthermore, as described for Example 2, the developed printing plates were used for printing, and prints accurately reproducing the image in a range of 2 to 98% could be obtained. The heat sensitive layer remaining rates were measured as described for Example 1, and the results are shown in Table 2.

Comparative Examples 9 and 10

Image reproducibility ranges were evaluated as described for Example 2, except that water was used in the first tank, water in the second tank, and water in the third tank in Comparative Example 9, or that water was used in the first tank, the <developer> in the second tank, and the <after-treatment liquid> in the third tank in Comparative Example 10, respectively for developing the directly imageable waterless planographic printing plate precursor 4. The sensitivities of the plates were as low as 1 marks, and since a high energy (not less than 300 mJ/$cm^2$) was necessary for reproducing the image, the plate processing efficiency was low. The heat sensitive layer remaining rates at 300 mJ/$cm^2$ were measured as described for Example 1, and found to be as low as 32% and 19% respectively, to indicate that the heat sensitive layers at the image area were mostly removed.

TABLE 2

| | Printing | Liquids used in the automatic processor | | | Results | | |
|---|---|---|---|---|---|---|---|
| | plate used | First tank | Second tank | Third tank | Sensitivity | Image | Heat sensitive layer remaining rate |
| Example 2 | 3 | <Pre-treatment liquid 1> | water | water | 4 | 2%~98% | 80% at 180 mJ/$cm^2$ |
| Example 3 | | <Pre-treatment liquid 2> | water | water | 4 | 2%~98% | 82% at 180 mJ/$cm^2$ |
| Example 4 | | <Pre-treatment liquid 3> | water | water | 5 | 2%~98% | 71% at 180 mJ/$cm^2$ |
| Example 5 | | <Pre-treatment liquid 4> | water | water | 4 | 2%~98% | 85% at 180 mJ/$cm^2$ |
| Example 6 | | <Pre-treatment liquid 5> | water | water | 6 | 2%~98% | 75% at 180 mJ/$cm^2$ |
| Example 7 | | <Pre-treatment liquid 1> | <Developer> | <After-treatment liquid> | 5 | 2%~98% | 72% at 180 mJ/$cm^2$ |
| Comparative Example 4 | | Water | water | water | 1 | 10%~90% | |
| Example 8 | | <Pre-treatment liquid 6> | water | water | 6 | 2%~98% | 80% at 130 mJ/$cm^2$ |
| Example 9 | | <Pre-treatment liquid 7> | water | water | 6 | 2%~98% | 88% at 130 mJ/$cm^2$ |
| Example 10 | | <Pre-treatment liquid 8> | water | water | 4 | 2%~98% | 75% at 180 mJ/$cm^2$ |
| Comparative Example 5 | | <Pre-treatment liquid 9> | water | water | 7 | Peeled at shadow region | |
| Comparative Example 6 | | <Pre-treatment liquid 10> | water | water | — | X | |
| Example 11 | | <Pre-treatment liquid 11> | water | water | 6 | 2%~98% | 82% at 130 mJ/$cm^2$ |
| Example 12 | | <Pre-treatment liquid 12> | water | water | 6 | 2%~98% | 83% at 130 mJ/$cm^2$ |
| Example 13 | | <Pre-treatment liquid 13> | water | water | 6 | 2%~98% | 73% at 130 mJ/$cm^2$ |
| Example 14 | | <Pre-treatment liquid 7> | <Developer> | <After-treatment liquid> | 7 | 2%~98% | 69% at 130 mJ/$cm^2$ |
| Comparative Example 7 | | <Pre-treatment liquid 14> | water | water | — | X | |
| Comparative Example 8 | | <Pre-treatment liquid 15> | water | water | 3 | Many flaws | |
| Example 15 | 4 | <Pre-treatment liquid 16> | water | <After-treatment liquid> | 4 | 2%~98% | 65% at 180 mJ/$cm^2$ |
| Example 16 | | <Pre-treatment liquid 16> | <Developer> | <After-treatment liquid> | 5 | 2%~98% | 59% at 180 mJ/$cm^2$ |
| Example 17 | | <Pre-treatment liquid 1> | water | water | 3 | 2%~98% | 58% at 210 mJ/$cm^2$ |
| Example 18 | | <Pre-treatment liquid 7> | water | water | 6 | 2%~98% | 70% at 130 mJ/$cm^2$ |
| Example 19 | | <Pre-treatment liquid 7> | <Developer> | water | 6 | 2%~98% | 64% at 130 mJ/$cm^2$ |
| Comparative Example 9 | | water | water | water | 1 | 2%~98% | 32% at 130 mJ/$cm^2$ |
| Comparative Example 10 | | water | <Developer> | <After-treatment liquid> | 1 | 2%~98% | 19% at 130 mJ/$cm^2$ |

Setter: FX400-AP
400 mJ/$cm^2$(0 marks), 300 mJ/$cm^2$(1 marks), 250 mJ/$cm^2$(2 marks), 210 mJ/$cm^2$(3 marks), 180 mJ/$cm^2$(4 marks), 150 mJ/$cm^2$(5 marks), 130 mJ/$cm^2$(6 marks), 110 mJ/$cm^2$(7 marks),

EXAMPLE 20

The directly imageable waterless printing plate precursor 5 was installed in FX400-AP (plate processing machine produced by Toray Engineering Co.) after removing "Torayfan", and pulse-exposed at any of various irradiation energies for an exposure time of 10 μs.

In succession, an automatic processor, TWL-650 produced by Toray Industries, Inc. was used for development. In this case, the <pre-treatment liquid 17> was used in the first tank, and water was used in the second and third tanks. The plate was immersed in the pre-treatment liquid at 35° C. for 30 seconds.

Evaluation was effected similarly. It was found that the silicone rubber layer at the laser beam irradiated area was removed in a range 350 mJ/s or more, and that the image could be accurately reproduced in a range of 2% to 98% at a resolution of 175 lines/inch.

Industrial Applicability

The present invention can provide a directly imageable waterless planographic printing plate having a high sensitivity and good image reproducibility and allowing a heat sensitive layer to remain even after development.

What is claimed is:

1. A method of producing a directly imageable waterless planographic printing plate, which has at least a heat sensitive layer and an ink repellent layer in this order on a substrate, comprising:

imagewisely irradiating a precursor of the printing plate with a laser beam, pre-treating the precursor by a pre-treatment liquid containing a glycol compound and/or a glycol ether compound represented by the following general formula (I), and removing the ink repellent layer at the laser beam irradiated area, in this order, wherein the heat sensitive layer is at least partially left on the printing plate after completion of the above steps, wherein the heat sensitive layer comprises a light-heat converting substance, a metal-containing organic compound and an active hydrogen-containing compound and wherein the general formula (I) is the following:

$$R^2O(-CHR^1-CH_2O)_n-R^3 \quad (I)$$

wherein $R^1$ denotes a hydrogen atom or alkyl group with 1 to 5 carbon atoms;

$R^2$ and $R^3$ denote, respectively independently, a hydrogen atom or alkyl group with 1 to 15 carbon atoms; and n denotes an integer of 1 to 12.

2. A method of producing a directly imageable planographic printing plate, according to claim 1, wherein the temperature of the pre-treatment liquid in the second step is 30 to 60° C. and the pre-treatment time is 10 to 100 seconds.

3. A method of producing a directly imageable waterless planographic printing plate, which has at least a heat sensitive layer and an ink repellent layer in this order on a substrate, comprising:

imagewisely irradiating a precursor of the printing plate with a laser beam, pre-treating the precursor by a pre-treatment liquid containing an amine compound by 0.1 to 30 wt % based on the weight of the entire pre-treatment liquid, and removing the ink repellent layer at the laser beam irradiated area, in this order, wherein the heat sensitive layer is at least partially left on the printing plate after completion of the above steps.

4. A method of producing a directly imageable planographic printing plate, according to claim 3, wherein the light transmittance, in the heat sensitive layer, of the light with the same wavelength as that of the laser beam applied in the first step is less than 20%.

5. A method of producing a directly imageable planographic printing plate, according to claim 3, wherein the heat sensitive layer contains at least a compound (A) capable of absorbing a laser beam for generating heat and a compound (B) capable of causing reaction by heat for improving the dissolvability or swelling rate.

6. A method of producing a directly imageable planographic printing plate, according to claim 3, wherein the heat sensitive layer comprises a light-heat converting substance, a metal-containing organic compound and an active hydrogen-containing compound.

7. A method of producing a directly imageable planographic printing plate, according to claim 3, wherein the temperature of the pre-treatment liquid in the second step is 30 to 60° C. and the pre-treatment time is 10 to 100 seconds.

* * * * *